(12) United States Patent
Silverbrook et al.

(10) Patent No.: US 7,854,171 B2
(45) Date of Patent: Dec. 21, 2010

(54) TEMPERATURE COMPENSATED MINIATURE PRESSURE SENSOR

(75) Inventors: Kia Silverbrook, Balmain (AU); Samuel George Mallinson, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 278 days.

(21) Appl. No.: 12/234,680

(22) Filed: Sep. 21, 2008

(65) Prior Publication Data

US 2009/0044630 A1   Feb. 19, 2009

Related U.S. Application Data

(63) Continuation of application No. 11/543,047, filed on Oct. 5, 2006, now Pat. No. 7,549,342, which is a continuation of application No. 11/074,775, filed on Mar. 9, 2005, now Pat. No. 7,137,302, which is a continuation of application No. 10/965,717, filed on Oct. 18, 2004, now Pat. No. 6,968,744.

(51) Int. Cl.
*G01L 9/12* (2006.01)
(52) U.S. Cl. .............................. 73/724; 73/708; 73/715; 73/716; 73/754
(58) Field of Classification Search .................. None
See application file for complete search history.

(56) References Cited

U.S. PATENT DOCUMENTS

| | | | |
|---|---|---|---|
| 4,173,149 A * | 11/1979 | Critten et al. ................. 73/706 |
| 4,571,543 A * | 2/1986 | Raymond et al. ........... 324/425 |
| 4,618,844 A | 10/1986 | Takahashi et al. | |
| 5,499,158 A | 3/1996 | Bishop et al. | |
| 5,853,020 A | 12/1998 | Widner | |
| 6,051,853 A | 4/2000 | Shimada et al. | |
| 6,058,780 A | 5/2000 | Bernot et al. | |
| 6,295,875 B1 | 10/2001 | Frick et al. | |
| 6,405,132 B1 | 6/2002 | Breed et al. | |
| 6,484,080 B2 | 11/2002 | Breed et al. | |
| 6,487,911 B1 | 12/2002 | Frackelton et al. | |
| 6,526,352 B1 | 2/2003 | Breed et al. | |
| 6,533,316 B2 | 3/2003 | Breed et al. | |
| 6,556,418 B2 | 4/2003 | Aigner et al. | |
| 6,568,274 B1 | 5/2003 | Lucas et al. | |
| 6,648,367 B2 | 11/2003 | Breed et al. | |
| 6,662,642 B2 | 12/2003 | Breed et al. | |
| 6,733,036 B2 | 5/2004 | Breed et al. | |
| 6,738,697 B2 | 5/2004 | Breed | |
| 6,741,169 B2 | 5/2004 | Magiawata et al. | |

(Continued)

FOREIGN PATENT DOCUMENTS

DE    4435909 A1    4/1995

(Continued)

*Primary Examiner*—Lisa M Caputo
*Assistant Examiner*—Jermaine Jenkins

(57) ABSTRACT

The present invention relates to a temperature-compensated pressure sensor assembly for fitting within the valve stem of a vehicle tire. The assembly includes a substrate assembly defining a plurality of holes. A pressure sensor is mounted to the substrate assembly. The pressure sensor includes a first deflectable membrane defining a first chamber and a first cap mounted to the membrane to form a second chamber. A temperature compensation sensor is mounted to the substrate assembly. The temperature compensation sensor includes a second deflectable membrane mounted to the substrate assembly to define a third chamber and a second cap mounted to the other membrane to form a fourth chamber.

8 Claims, 28 Drawing Sheets

U.S. PATENT DOCUMENTS

| | | |
|---|---|---|
| 6,758,089 B2 | 7/2004 | Breed et al. |
| 6,768,944 B2 | 7/2004 | Breed et al. |
| 6,892,582 B1 | 5/2005 | Satou et al. |
| 7,353,711 B2 | 4/2008 | O'Dowd et al. |
| 7,581,447 B2 | 9/2009 | Silverbrook et al. |
| 2001/0032515 A1 | 10/2001 | Willcox et al. |
| 2002/0178818 A1 | 12/2002 | Nakabayashi |

FOREIGN PATENT DOCUMENTS

| | | |
|---|---|---|
| EP | 0261972 A2 | 3/1988 |
| EP | 0756164 A2 | 1/1997 |
| JP | 07-260612 A | 10/1995 |
| JP | 09-257618 | 10/1997 |
| JP | 2002-111011 | 4/2002 |
| JP | 2004-517305 | 4/2002 |
| WO | WO 03/106952 A2 | 12/2003 |

* cited by examiner

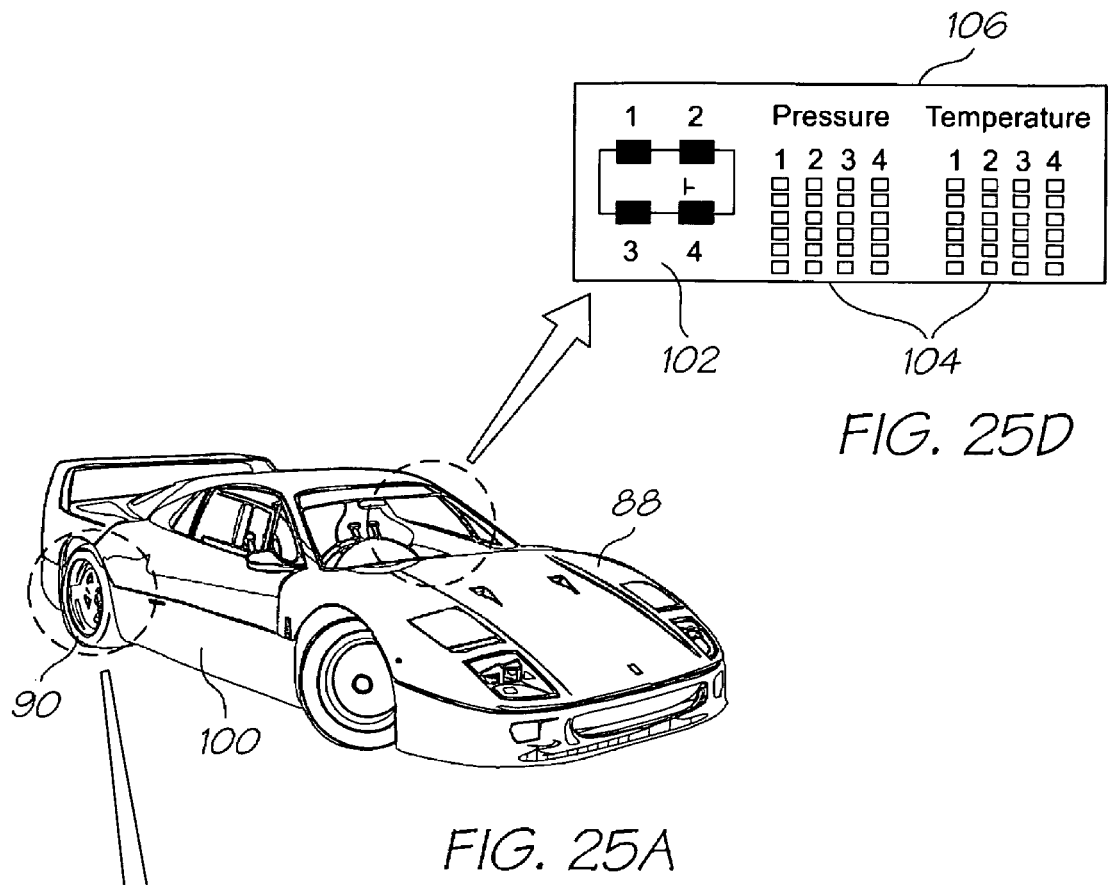
FIG. 25D
FIG. 25A
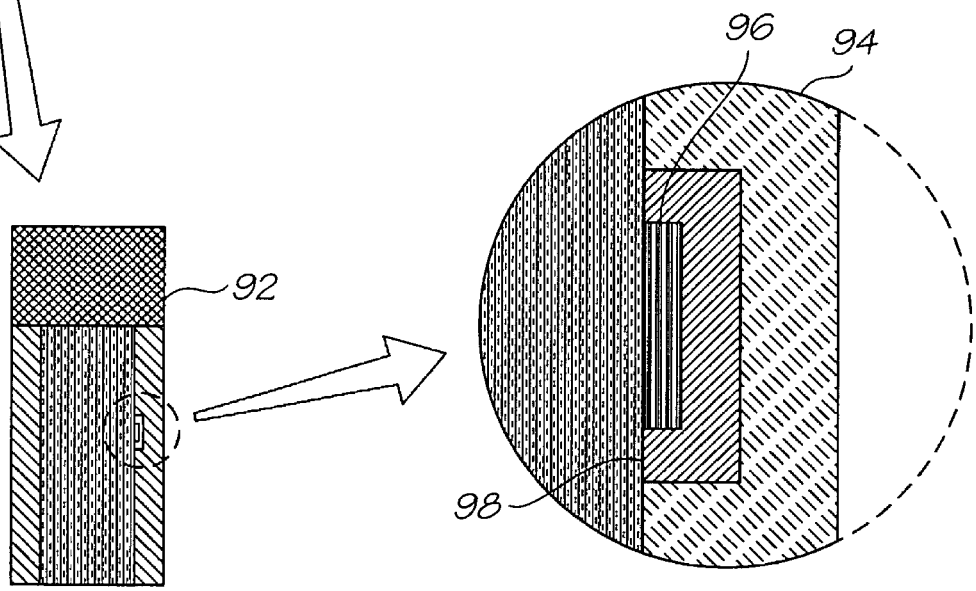
FIG. 25B
FIG. 25C

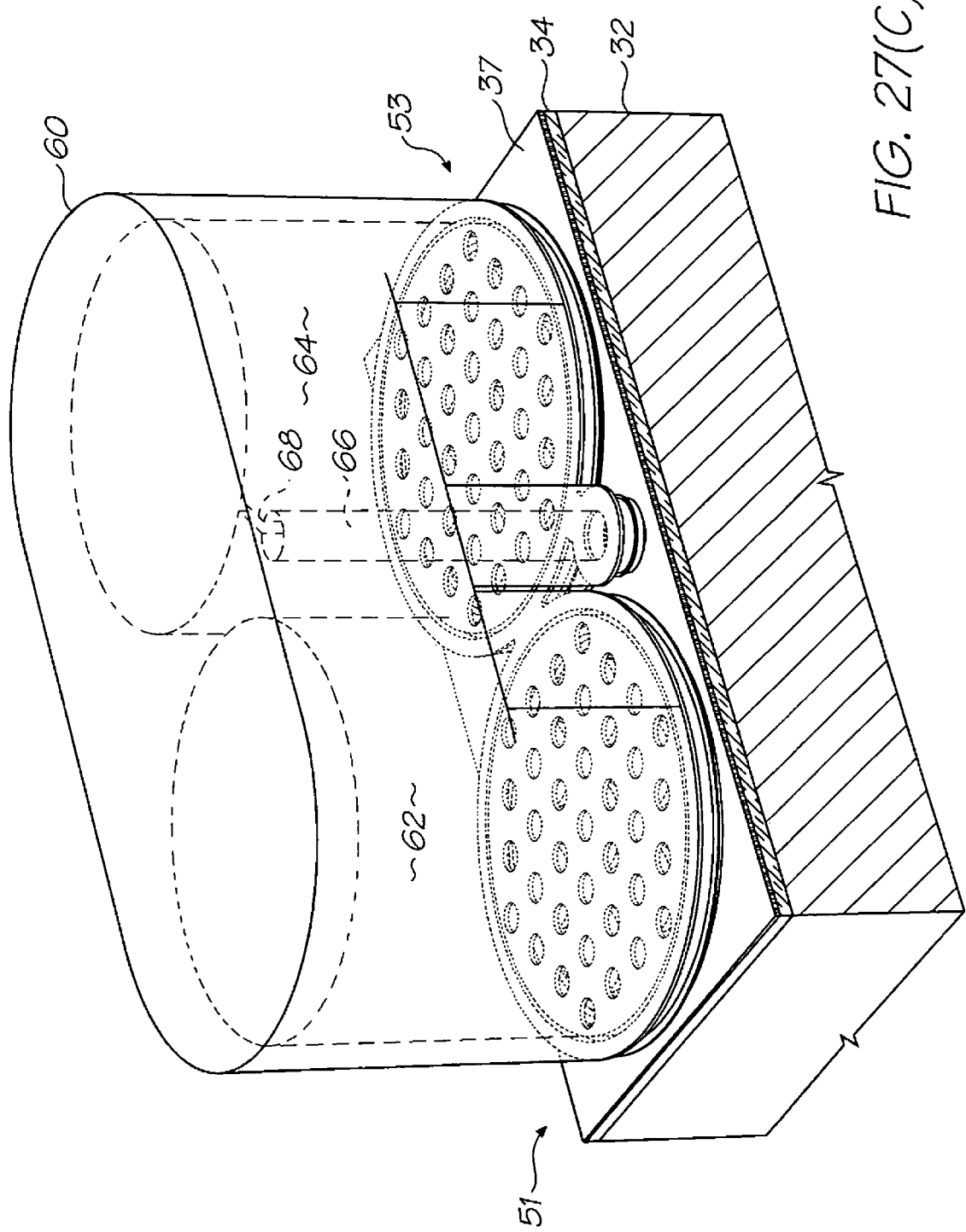

TEMPERATURE COMPENSATED MINIATURE PRESSURE SENSOR

CROSS REFERENCE TO RELATED APPLICATIONS

The present application is a continuation of U.S. Ser. No. 11/543,047 filed on Oct. 5, 2006, which is a continuation of U.S. application Ser. No. 11/074,775 filed Mar. 9, 2005, now issued as U.S. Pat. No. 7,137,302, which is a continuation of U.S. application Ser. No. 10/965,717 filed Oct. 18, 2004, now issued as U.S. Pat. No. 6,968,744, the entire contents of which are herein incorporated by reference.

TECHNICAL FIELD

The present invention generally relates to a pressure sensor and in particular, a micro-electro mechanical (MEMS) pressure sensor.

CO-PENDING APPLICATIONS

Various methods, systems and apparatus relating to the present invention are disclosed in the following co-pending applications filed by the applicant or assignee of the present invention simultaneously with application No. U.S. Ser. No. 11/543,047:

| | | | | | |
|---|---|---|---|---|---|
| 7093494 | 7143652 | 7089797 | 7159467 | 7234357 | 7124643 |
| 7121145 | 7089790 | 7194901 | 7089798 | 7240560 | |

The disclosures of these co-pending applications are incorporated herein by cross-reference.

CROSS REFERENCES TO RELATED APPLICATIONS

The following patents or patent applications filed by the applicant or assignee of the present invention are hereby incorporated by cross-reference.

| | | | | | |
|---|---|---|---|---|---|
| 6716666 | 6949217 | 6750083 | 7014451 | 6777259 | 6923524 |
| 6557978 | 6991207 | 6766998 | 6967354 | 6759723 | 6870259 |
| 10/853270 | 6925875 | 10/898214 | | | |

BACKGROUND ART

The invention has wide-ranging application across many fields of industry. It is particularly suited to pressure measurement in harsh or dynamic environments that would preclude many other pressure sensors. These applications include, but are not limited to:
 monitoring engine pressure (cars, aircraft, ships, fuel cells)
 sensors for high speed wind tunnels
 sensors to monitor explosions
 sensors for boilers
 sensors for dish-washing machines
 sensors for irons (both domestic and industrial)
 sensors for other steam based machines where overpressure can lead to destruction and loss of life.

However, in the interests of brevity, the invention will be described with particular reference to a tire pressure monitor and an associated method of production. It will be appreciated that the Tire Pressure Monitoring System (TPMS) described herein is purely illustrative and the invention has much broader application.

Transportation Recall Enhancement, Accountability and Documentation (TREAD) legislation in the United States seeks to require all U.S. motor vehicles to be fitted with a tire pressure monitoring system (TPMS). This is outlined in U.S. Dept. of Transportation, "Federal Motor Vehicle Safety Standards: Tire Pressure Monitoring Systems; Controls and Displays", US Federal Register, Vol. 66, No. 144, 2001, pp. 38982-39004. The impetus for this development comes from recent Firestone/Ford Explorer incidents which led to a number of fatal accidents. A careful assessment of tire inflation data found that approximately 35% of in-use tires are under inflated, whilst an assessment of the effect of a TPMS found that between 50 to 80 fatalities, and 6000 to 10,000 non-fatal injuries, per annum could possibly be prevented. This is discussed in U.S. Dept. of Transportation, "Tire Pressure Monitoring System," FMVSS No. 138,2001. European legislation also appears likely to require the fitting of a TPMS to increase tire life, in an effort to reduce the number of tires in use by 60% in the next 20 years, so as to minimise the environmental impacts.

Two different kinds of TPMS are currently known to be available in the marketplace. One kind of TPMS is based on differences in rotational speed of wheels when a tire is low in pressure. The asynchronicity in rotational speed can be detected using a vehicle's anti-braking system (ABS), if present. The second kind of TPMS measures tire pressure directly and transmits a signal to a central processor. FIG. 1 (prior art) illustrates a schematic of a typical pressure measurement based TPMS 10. Sensors 12, provided with a transmitter, measure pressure in tires 13 and transmit a signal 14 to antenna 16. The data can then be relayed to a receiver 15 and processed and displayed to a driver of the vehicle 17 on display 18.

Table 1 lists some presently known TPMS manufacturers/providers. Motorola and Pacific Industries have each developed a TPMS, whilst other companies listed in Table 1 act as suppliers for TPMS manufacturers, including some automobile producers that install their own TPMS.

TABLE 1

Pressure sensor manufacturers involved in TPMS.

| Company | Supplier to | Type of Sensor |
|---|---|---|
| Motorola | Motorola | Capacitance |
| Pacific Industries | Pacific Industries | Piezoresistive |
| SensoNor | Siemens, TRW, Beru, Porsche, BMW, Ferrari, Mercedes, Toyota | Piezoresistive |
| Siemens | Goodyear | Piezoresistive |
| Transense Technologies | Under development | Surface Acoustic Wave |
| TRW/Novasensor | Smartire, Michelin, Schrader, Cycloid | Piezoresistive |

There are two main types of pressure sensor; resistive or capacitive. Both types of these sensors rely on deflection of a membrane under an applied pressure difference. One side of the membrane is exposed to internal pressure of a tire while the other side of the membrane forms one wall of a sealed cavity filled with gas at a reference pressure.

The resistive-type sensors typically employ silicon-based micro-machining to form a Wheatstone bridge with four piezoresistors on one face of the membrane. The sensor responds to stress induced in the membrane. For capacitive-type sensors, the membrane forms one plate of a capacitor. In this case, the sensor responds to deflection induced in the membrane. Preferably, the responses should be linear with pressure, for predictability, up to at least a critical point.

Transense Technologies, listed in Table 1, have developed a different type of sensor, based on surface acoustic wave detection. This sensor relies on interferometric measurement of the stress-induced deflection of a reflective membrane. A fibre-optic cable both transmits and receives laser light, with one end of the fibre-optic cable being inserted into the interferometer. This system is discussed in Tran, T. A. Miller III, W. V., Murphy, K. A., Vengsarkar, A. M. and Claus, R. O., "Stablized Extrinsic Fiber Optic Fabry-Perot Sensor for Surface Acoustic Wave Detection", *Proc. Fiber Optic and Laser Sensors IX*, SPIE vol. 1584, pp 178-186, 1991.

Presently, there are also a variety of different kinds of deployment means for sensors in a TPMS, including valve cap and valve stem based systems, systems with the sensor mounted on the wheel rim or wheel hub, and also a tire-wheel system developed by an alliance of several tire manufacturers which has a sensor embedded in the wheel frame itself. These different kinds of deployment in TPMS are listed in Table 2.

for Self-Compensated Capacitive Pressure Sensor," *Proc. 6th IEEE Int. Conf. Electronics, Circuits and Systems*, Vol 2, pp. 1059-1063, 1999).

Supplying power to pressure sensors within tires poses several problems. The simplest option is a long life battery however, this significantly increases the overall size of the sensor which can limit the installation sites. Reducing the size of the battery risks reducing the battery life less than the tire life.

The reference to any prior art in this specification is not, and should not be taken as, an acknowledgment or any form of suggestion that such prior art forms part of the common general knowledge.

SUMMARY OF THE INVENTION

Accordingly the present invention provides a pressure sensor comprising:

a chamber partially defined by a flexible membrane, the chamber containing a fluid at a reference pressure, such that the flexible membrane deflects due to pressure differentials

TABLE 2

Specifications of TPMS in production.

| Company/Group | Type of System | Fitted to | Warning Level (psi) | Accuracy (psi) | Sampling |
|---|---|---|---|---|---|
| Beru | Wheel Rim | Audi, BMW, Mercedes | user set | 1 | every 3 sec, transmitted every 54 sec |
| Cycloid | Wheel Cap (pump) | Ford, Goodyear | 18 | 1 | 30 sec/10 min |
| Fleet | Valve Cap | heavy vehicles | 20 | 1 | 3.5 sec |
| Johnson | Valve Stem | AM | 19.9 | 1 | 15 min |
| Michelin/Goodyear/Pirelli/Dunlop | PAX System | Renault, Caddillac | ? | ? | ? |
| Motorola | Wheel Rim | AM | ? | ? | 6 sec |
| Omron | Valve Stem | AM | ? | ? | ? |
| Pacific Industries | Valve Stem | AM | 20.3/user set | 1.8 | 15 sec/10 min |
| Schrader | Valve Stem | Corvette, Peugeot, Cadillac | 22 | 2% | ? |
| Smartire | Wheel Rim | Aston Martin, Lincoln, AM | ? | 1.5 | 6 sec |

AM = products fitted to a vehicle after vehicle purchase (After Market).

To increase battery life, most TPMS are in stand-by mode for the majority of time, only operating at set intervals. The U.S. legislation requires the system to alert the driver within a set time of detecting significant tire under-inflation conditions. It also requires a warning light to signal when the tire is either 20% or 25% under-inflated. Most of the devices presently available in the market are accurate to within ±1 psi, which represents ±3% for a tire pressure of 30 psi. More generally, the sensor should perform in a harsh environment, with temperatures up to 130° C. and accelerations of 1000 g or more. Tire pressure increases and decreases in response to corresponding changes in temperature. Most systems presently available include a sensor to account for thermally induced changes in tire pressure sensor sensitivity (Menini, Ph., Blasquez, G., Pons, P., Douziech, C. Favaro, P. and Dondon, Ph., "Optimization of a BiCMOS Integratetd Transducer between the reference pressure and the fluid pressure, the membrane being at least partially formed from conductive material;

a conductive layer within the chamber spaced from the flexible membrane such that they form opposing electrodes of a capacitor; and, associated circuitry for converting the deflection of the flexible membrane into an output signal indicative of the fluid pressure; wherein, the membrane is at least partially formed from a transition metal nitride.

Transition metal nitrides are a metal ceramics with high yield strength and metallic bonding that makes it suitable for use in extreme environments. They can also readily include an oxidizing component such as aluminium so that the membrane form a passivating surface oxide layer to protect it from oxidative failure.

Preferably, the conductive layer is less than 50 microns from the membrane in its undeflected state. A capacitive pressure sensor with closely spaced electrodes can have small surface area electrodes while maintaining enough capacitance for the required operating range. However, small electrodes reduce the power consumption of the sensor which in turn reduces the battery size needed for the operational life of the sensor.

A first related aspect provides a pressure sensor for sensing a fluid pressure, the pressure sensor comprising:

a chamber partially defined by a flexible membrane, the chamber containing a fluid at a reference pressure, such that the flexible membrane deflects from any pressure difference between the reference pressure and the fluid pressure, the membrane being at least partially formed from conductive material; and, associated circuitry for converting the deflection of the flexible membrane into an output signal indicative of the fluid pressure; wherein, the chamber, the flexible membrane and the associated circuitry are formed on and through a wafer substrate using lithographically masked etching and deposition techniques.

The lithographically masked etching and deposition techniques used in the semiconductor chip manufacturing industry can produce many separate devices from a single wafer with high yields and low defect rates. Applying these fabrication techniques to MEMS pressure sensors and associated CMOS circuitry allows high volumes and high yields that dramatically reduce the unit cost of individual sensors.

A second related aspect provides a pressure sensor for sensing a fluid pressure, the pressure sensor comprising:

a chamber partially defined by a flexible membrane, the chamber containing a fluid at a reference pressure, such that the flexible membrane deflects due to pressure differentials between the reference pressure and the fluid pressure; and, associated circuitry for converting the deflection of the flexible membrane into an output signal indicative of the fluid pressure; wherein, the membrane is less than 0.1 grams.

Designing and fabricating the sensor to minimize the mass of the membrane decreases the effects of acceleration on the membrane deflection. At the same time, a low mass has no effect on the membrane deflection from the pressure differential between the reference fluid and the air pressure.

A third related aspect provides a pressure sensor for sensing a fluid pressure, the pressure sensor comprising:

first and second chambers having first and second flexible membranes respectively, the first and second flexible membranes configured to deflect in response to pressure differences within the first and second chambers respectively, the first membrane arranged for exposure to the fluid pressure and the second membrane sealed from the fluid pressure; and, associated circuitry for converting the deflection of the first flexible membrane into an output signal related to the fluid pressure, and converting the deflection of the second membrane into an adjustment of the output signal to compensate for the temperature of the sensor.

By sealing the second chamber from the tire pressure, the deflection of the second membrane can be determined as a function of temperature. This can be used to calibrate the output signal from the first chamber to remove the effects of temperature variation.

A fourth related aspect provides a pressure sensor for sensing a fluid pressure, the pressure sensor comprising:

a chamber partially defined by a flexible membrane, the chamber containing a fluid at a reference pressure, such that the flexible membrane deflects due to pressure differentials between the reference pressure and the fluid pressure; and, associated circuitry for converting the deflection of the flexible membrane into an output signal indicative of the fluid pressure; wherein, the membrane is at least partially formed from a conductive ceramic material.

Conductive ceramics, such as metal ceramics, have previously been used to coat tool steels because of its corrosion and wear resistance. Surprisingly, it can be deposited as a thin membrane with sufficient flexibility for sensing pressure while retaining its corrosion and wear resistance. Furthermore, these materials are generally well suited to micro fabrication processes and electrically conductive so they can be used in capacitative and resistive type pressure sensors.

A fifth related aspect provides a pressure sensor for sensing a fluid pressure, the pressure sensor comprising:

a first wafer substrate with a front side and an opposing back side, a chamber partially defined by a flexible membrane formed on the front side and at least one hole etched from the back side to the chamber;

a second wafer on the back side of the first wafer to seal the at least one hole;

wherein, the chamber contains a fluid at a reference pressure, such that the flexible membrane deflects due to pressure differentials between the reference pressure and the fluid pressure; and, associated circuitry for converting the deflection of the flexible membrane into an output signal indicative of the fluid pressure; wherein, the second wafer is wafer bonded to the first wafer substrate.

Wafer bonding offers an effective non-adhesive solution. It provides a hermetic seal with only minor changes to the fabrication procedure. Skilled workers in this field will readily understand that the most prevalent forms of wafer bonding are:

direct wafer, or silicon fusion, bonding;
anodic, or electrostatic Mallory process bonding; and,
intermediate layer bonding.

These forms of wafer bonding are discussed in detail below, and they all avoid the unacceptable air permeability associated with adhesive and polymer coatings.

A sixth related aspect provides a pressure sensor for sensing a fluid pressure, the pressure sensor comprising:

a chamber partially defined by a flexible membrane, the chamber containing a fluid at a reference pressure, such that the flexible membrane deflects due to pressure differentials between the reference pressure and the fluid pressure; and, associated circuitry for converting the deflection of the flexible membrane into an output signal indicative of the fluid pressure; wherein, the membrane is non-planar.

It is possible to extend the linear range of the pressure-deflection response with a non-planar membrane. Corrugations, a series of raised annuli or other surface features are an added complexity in the fabrication process but can extend the linear range of the sensor by 1 MPa.

A seventh related aspect provides a pressure sensor for sensing a fluid pressure, the pressure sensor comprising:

a chamber partially defined by a flexible membrane, the flexible membrane at least partially formed from conductive material, and the chamber containing a fluid at a reference pressure, such that the flexible membrane deflects from any pressure difference between the reference pressure and the fluid pressure;

a conductive layer within the chamber spaced from the flexible membrane; and, associated circuitry incorporating the flexible membrane and the conductive layer; such that, the conductive layer and the flexible membrane form capacitor electrodes and the deflection of the flexible membrane changes the capacitance which the associated circuitry converts into an output signal indicative of the fluid pressure; wherein, the conductive layer is arranged such that deflection of the membrane towards the conductive layer can displace the fluid from between the membrane and the conductive layer.

Venting the fluid between the electrodes to the other side of the fixed electrode, while keeping the chamber sealed, avoids the extreme fluid pressure that cause the squeeze film damping.

A eighth related aspect provides a pressure sensor for sensing a fluid pressure, the pressure sensor comprising:

a chamber partially defined by a flexible membrane, the flexible membrane is a laminate having at least two layers wherein at least one of the layers is at least partially formed from conductive material, and the chamber containing a fluid at a reference pressure, such that the flexible membrane deflects from any pressure difference between the reference pressure and the fluid pressure; and, associated circuitry for converting deflection of the flexible membrane into an output signal indicative of the fluid pressure.

Forming the membrane from a number of separately deposited layers alleviates internal stress in the membrane. The layers can be different materials specifically selected to withstand harsh environments.

A ninth related aspect provides a method of fabricating pressure sensor for sensing a fluid pressure, the method of fabrication comprising:

etching a recess in a wafer substrate;

depositing a flexible membrane to cover the recess and define a chamber such that during use the chamber contains a fluid at a reference pressure and the flexible membrane deflects from a pressure difference between the reference pressure and the fluid pressure;

depositing associated circuitry for converting the deflection of the flexible membrane into an output signal indicative of the fluid pressure; and, depositing an apertured guard over the membrane.

An aspect closely related to the ninth aspect provides a pressure sensor for sensing a fluid pressure, the pressure sensor comprising:

a wafer substrate with a recess;

a flexible membrane covering the recess to define a chamber containing a fluid at a reference pressure, such that the flexible membrane deflects due to pressure differentials between the reference pressure and the fluid pressure;

associated circuitry for converting the deflection of the flexible membrane into an output signal indicative of the fluid pressure; and, an apertured guard over the membrane formed using lithographically masked etching and deposition techniques.

By depositing material over the membrane to form the guard offers greater time efficiency and accuracy than producing a guard separately and securing it over the membrane. Semiconductor etching and deposition techniques allow highly intricate surface details. The apertures in the guard can be made smaller to exclude more particles from contacting the membrane. The fine tolerances of lithographic deposition permit the guard to be positioned close to the membrane for a more compact overall design.

A tenth related aspect provides a pressure sensor for sensing a fluid pressure, the pressure sensor comprising:

a chamber partially defined by a flexible membrane, the chamber containing a fluid at a reference pressure, such that the flexible membrane deflects from any pressure difference between the reference pressure and the fluid pressure, the membrane being at least partially formed from conductive material; and, associated circuitry for converting the deflection of the flexible membrane into an output signal indicative of the fluid pressure; wherein, the flexible membrane is less than 3 microns thick.

The operational range of the pressure sensor requires the membrane to have a certain deflection. For a given material, the deflection of the membrane will depend on, inter alia, its area and its thickness. Minimizing the thickness of the membrane allows the use of a high yield strength membrane material. A thinner membrane also allows the area of the membrane to be reduced. Reducing the area of the membrane reduces the power consumption and the overall size of the sensor. A high yield strength material is better able to withstand the extreme conditions within the tire and a compact design can be installed in restricted spaces such as the valve stem.

A eleventh related aspect provides a pressure sensor for sensing a fluid pressure, the pressure sensor comprising:

a chamber partially defined by a flexible membrane, the chamber containing a fluid at a reference pressure, such that the flexible membrane deflects from any pressure difference between the reference pressure and the fluid pressure, the membrane being at least partially formed from conductive material; and, associated circuitry for converting the deflection of the flexible membrane into an output signal indicative of the fluid pressure; wherein, the associated circuitry is adapted to be powered by electromagnetic radiation transmitted from a point remote from the sensor.

Beaming energy to the sensor removes the need for long-life batteries, or can be used to supplement or charge the batteries. In either case, the sensor avoids the need for large batteries and is therefore small enough for installation in the valve stem or valve itself.

Optional and Preferred Features

Preferable and optional features of the various broad aspects of the invention are set out below. The skilled worker in the field will understand that while some of the features described below are optional for some of the above broad aspects of the invention, they are essential to other broad aspects.

Preferably the sensor is powered by radio waves transmitted from a remote source. Preferably the sensor is a capacitative pressure sensor with a conductive layer within the chamber spaced from the flexible membrane such that they form opposing electrodes of a capacitor. In a further preferred form the conductive layer is less than 50 microns from the membrane in its undeflected state.

Preferably, the membrane is circular with a diameter less than 500 microns. In a further preferred form the membrane is less than 300 microns and in specific embodiments the diameter is 100 microns.

In some preferred embodiments the membrane is approximately 0.5 µm thick. In further embodiments, the membrane is a 100 micron diameter circular film. Preferably the metal ceramic is a metal nitride. In specific embodiments, the membrane is titanium nitride, tantalum nitride, and vanadium nitride. The membrane may also be form from mixed metal nitrides. The mixed metal nitrides may be titanium silicon nitride, tantalum silicon nitride, vanadium silicon nitride, titanium aluminium silicon nitride, tantalum aluminium silicon nitride and so on.

Preferably, the flexible membrane is a laminate having at least two layers wherein at least one of the layers is at least partially formed from conductive material. The layers within the laminate may be formed from the deposition of different metal ceramics. Preferably, the metal ceramics are metal nitrides or mixed metal nitrides, such as titanium nitride, titanium aluminium nitride, tantalum silicon nitride, titanium aluminium silicon nitride, tantalum aluminium silicon nitride and so on. Layers of the laminate may also be metal such as titanium or vanadium.

In a particularly preferred form, the sensor further comprises a second chamber with a second membrane, the second chamber being sealed from the fluid pressure and the second membrane deflecting from a predetermined pressure difference in the second chamber; wherein, the associated circuitry converts the deflection of the second membrane into an adjustment of the output signal to compensate for the temperature of the sensor.

In some embodiments, the sensor is formed on and through a silicon wafer using lithographically masked etching and deposition techniques. In a further preferred form, the sensor is a capacitative sensor, wherein a conductive layer is deposited in each of the first and second chambers and the first and second flexible membranes are conductive, such that, the conductive layer in the first chamber and the first flexible membrane form capacitor electrodes wherein the deflection of the first flexible membrane changes the capacitance which the associated circuitry converts to the output signal.

Preferably, there is provided a CMOS layer disposed between the metallic layer and the substrate. In some embodiments, the sensor is additionally provided a passivation layer at least partially deposited over the metallic layer.

Optionally, the pressure sensor is adapted to sense the air pressure within a pneumatic tire.

Conveniently, the wafer is a first wafer substrate with a front side and an opposing back side, a recess etched into the front side and at least one hole etched from the back side to the recess; and the sensor further comprises:

a second wafer on the back side of the first wafer to seal the at least one hole; wherein, the second is wafer bonded to the wafer substrate.

Optionally, the wafer bonding is direct wafer bonding wherein the contacting surfaces of the first and second wafers are ultra clean, and activated by making them hydrophilic or hydrophobic prior to bonding, and then brought into contact at high temperature, preferably around 1000° C. Anodic bonding offers another option wherein the contacting surfaces of the first and second wafers have a large voltage applied across them. The wafers may be in a vacuum, air or an inert gas when the bond is formed. Intermediate layer bonding is a third option wherein a layer of low melting point material is applied to one or both of the contacting surfaces of the first and second wafers so that heat and pressure forms the wafer bond. Preferably the low melting point material is silicon nitride or titanium nitride. This option avoids the high surface cleanliness required by direct silicon bonding and the high voltages required by anodic bonding.

In some embodiments, the membrane is non-planar and preferably corrugated. In a further preferred form, the flexible corrugated membrane has a corrugation factor of 8. In a particularly preferred form, the sensor has a linear response up to about 1 MPa. In specific embodiments, the membrane corrugations have a period of between 5 microns and 15 microns, preferably about 10 microns. In some preferred embodiments, the membrane is substantially circular and the corrugations are annular. In a particularly preferred form, the corrugations have a substantially square-shaped cross-sectional profile.

Preferably the sensor further comprises an apertured guard over the membrane formed using lithographically masked etching and deposition techniques. In these embodiments, the guard is laminate having at least two layers. In a particularly preferred form the layers are different materials such as silicon nitride and silicon dioxide.

BRIEF DESCRIPTION OF THE FIGURES

Embodiments of the present invention is now described by way of example only, with reference to the accompanying drawings in which:

FIGS. 25a to 25d are a schematic representation of the installation of the sensor in the valve stem of a vehicle tire;

FIGS. 27(A) to 27(H) are partial perspectives (some partially sectioned) of a sensor according to an embodiment of the present invention;

DETAILED DESCRIPTION OF THE PREFERRED EMBODIMENTS

The following embodiments are described in order to provide a more precise understanding of the subject matter of the present invention. While the embodiments focus on a capacitative type sensor, ordinary workers in this field will readily understand that the invention is equally applicable to other forms of pressure sensor such as:

(i) Piezo-resistive, where the membrane is formed from a non-conductive material and the piezo material is in contact with the membrane. Deflections of the membrane give rise to piezo-induced changes in resistivity (and hence current, if a voltage is applied) that can be monitored electronically.
(ii) Resonant pressure sensors, where the frequency of oscillation of the membrane depends on the pressure difference. The initial resonance could be activated by using a time-varying electrostatic force between the two electrodes.
(iii) Force compensation pressure sensors, where an electrostatic force is applied to maintain the membrane at the initial position. Once again the electrostatic force between the two electrodes can be used to position the membrane.

Each of these sensor types has particular advantages and limitations. Piezo-resistive sensors are reasonably well known and understood but require the use of exotic materials. The sensors of (ii) and (iii) are less popular but do not require exotic materials. Capacitative sensors are typically robust and highly versatile and therefore the preferred embodiments will be based on this type of sensor.

Functional Overview

Figure 1:
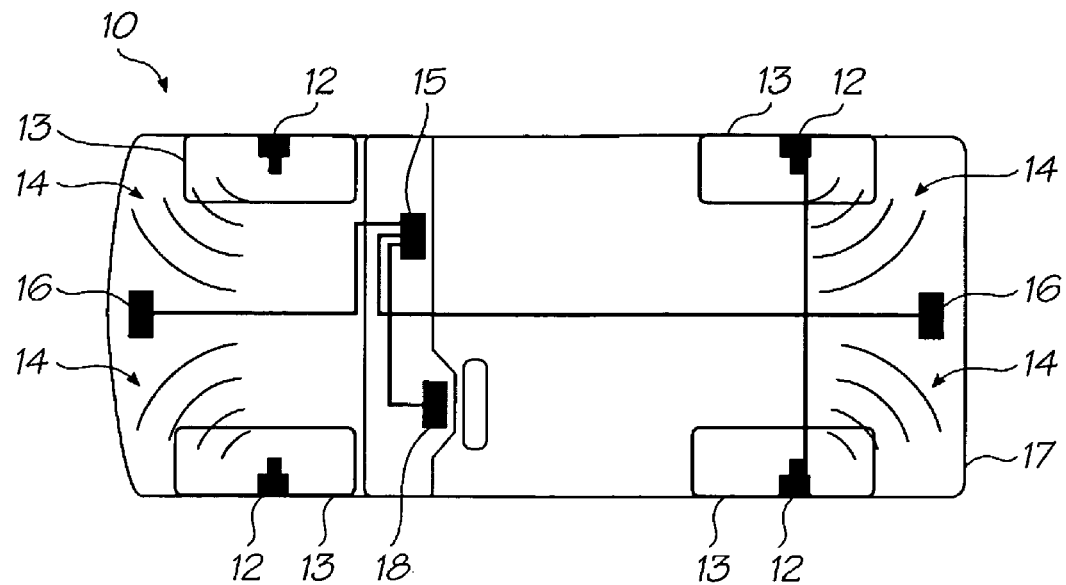
FIG. 1 (Prior art—http://www.pacific-ind.com/eng/products2/carsystem.html) illustrates a typical TPMS used in a four wheel vehicle.
Figure 2:
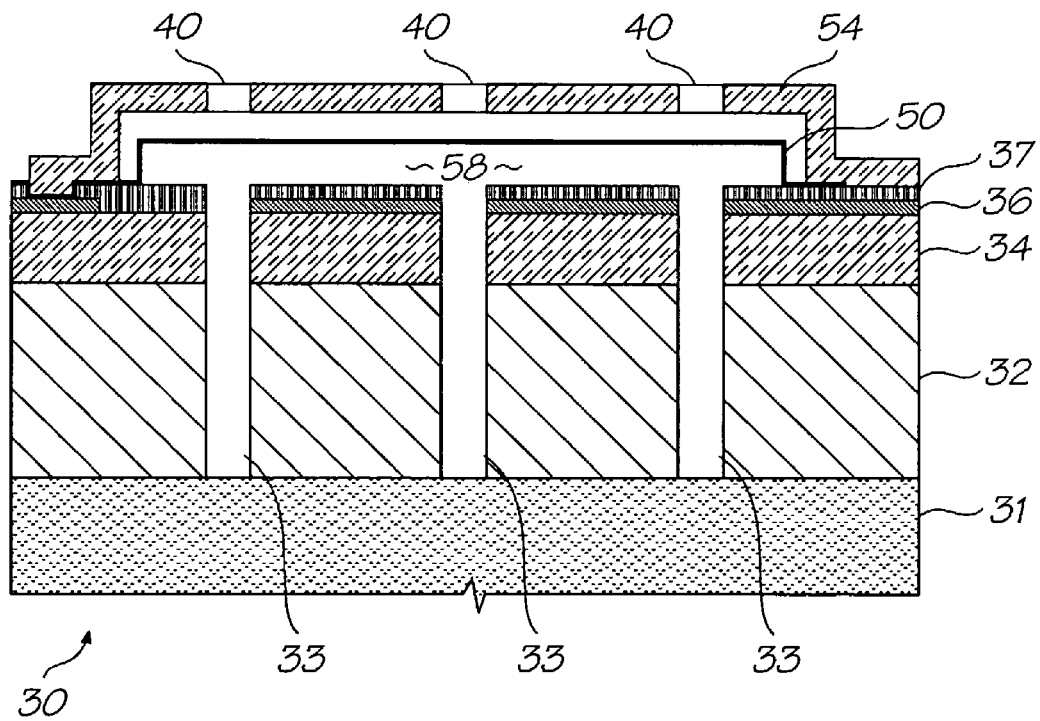
FIG. 2 is a schematic partial section of a sensor according to one embodiment of the present invention.

A brief overview of the basic operation of the sensor will be described with reference to FIG. 2. FIG. 2 shows a schematic partial section of a capacitative sensor fabricated using the masked lithographic etching and deposition techniques typically used in the production of semiconductor chips. The fabrication steps are described in detail below.

The sensor 30 is formed on a silicon substrate 32, provided with sealed channels or holes 33, on which is deposited a CMOS layer 34. A conductive layer 36 is deposited on the CMOS layer 34 followed by a passivation layer 37 as illustrated. The passivation layer 37 may be an insulating or semi-conducting material. A conductive membrane 50 is spaced from conductive layer 36 to form a reference chamber 58. Roof or cap 54 covers the membrane 54. The roof or cap 54 is provided with holes 40, or channels or the like, so that the membrane 50 is exposed to tire pressure.

The membrane 50 deflects due to differential stresses. The amount of deflection for a given pressure difference, depends on the membrane diameter and thickness, the nature of the support (for example, strongly fixed, weakly pinned), and the membrane material properties (for example elastic modulus, Poisson ratio, density).

Both the membrane 50 and conductive layer 36 are electrodes, which develop a capacitance, C, between them which depends upon the electrical permittivity of the ambient material, e, the electrode spacing, d, and the electrode area, A. For the case where both electrodes are circular disks, $C=eA/d$. The sensor is then calibrated for measured capacitance versus applied pressure.

Fabrication Overview

FIGS. 4, 6, 7, 9, 11, 12, 14, 16, 17, 19, 21, 22 and 23 show the main lithographic etching and deposition steps involved in the fabrication of a pressure sensor according to the invention. The masks associated with the successive steps are shown in FIGS. 3, 5, 8, 10, 13, 15, 18 and 20. When etching photoresistive material the solid black areas of the masks are the regions that are removed by the subsequent etch. However, when etching metal and other non-photoresistive layers, the blank or unmasked areas of the mask denote the regions that are removed. Skilled workers in this field will understand which masks are applied to photoresist and which are applied to non-photoresist.

Figure 3:
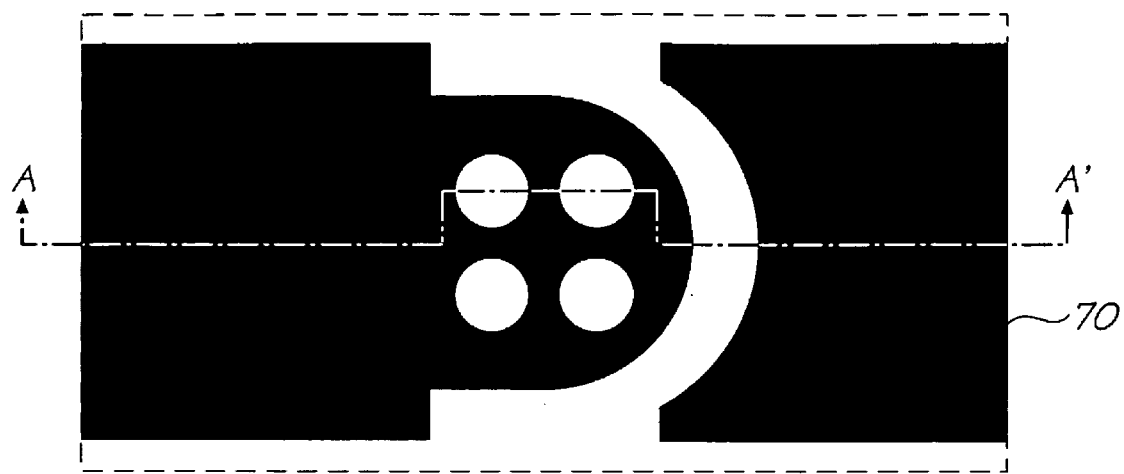
FIGS. 3, 5, 8, 10, 13, 15, 18 and 20 are schematic plan views of masks suitable for use in particular stages of the fabrication process.
Figure 4:
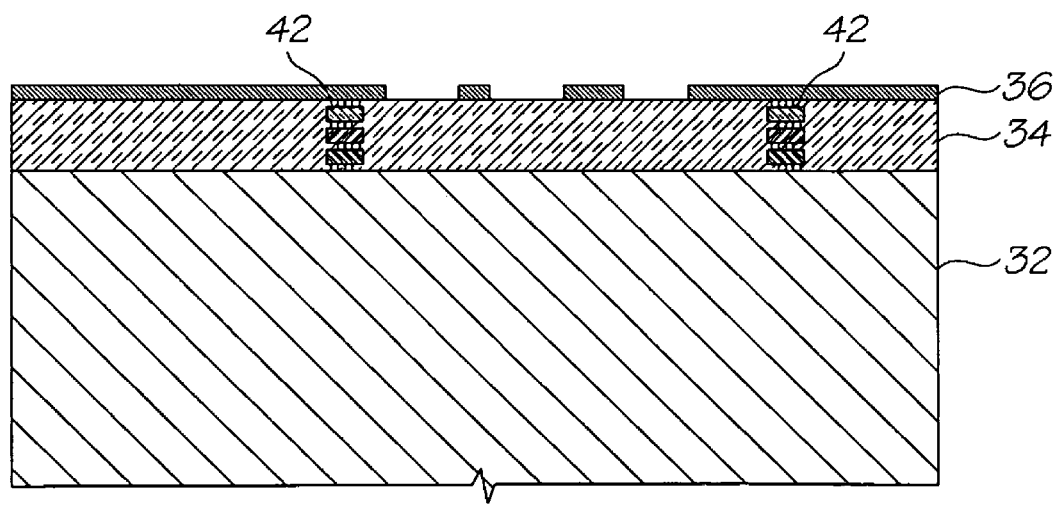
FIGS. 4, 6, 7, 9, 11, 12, 14, 16, 17, 19, 21, 22 and 23 illustrate sections of an embodiment at successive stages of fabrication.

FIG. 4 is section A-A' through the wafer 32 of a partially fabricated sensor. The silicon wafer 32 has previously been ground to the required thickness and CMOS circuitry 34 is deposited on its top surface. The final CMOS layer provides the bottom electrode 36 for the sensor. Guard rings 42 are formed in the metallization layers of the CMOS circuitry 34. The guard rings 42 prevent air or other fluid from diffusing from the subsequently etched sealed passages 33 (see FIG. 2) through the wafer 32 to the circuitry where it can cause corrosion. The mask 70 for this first metal layer 36 is shown in FIG. 3, with the blank regions being etched away.

Figure 5:
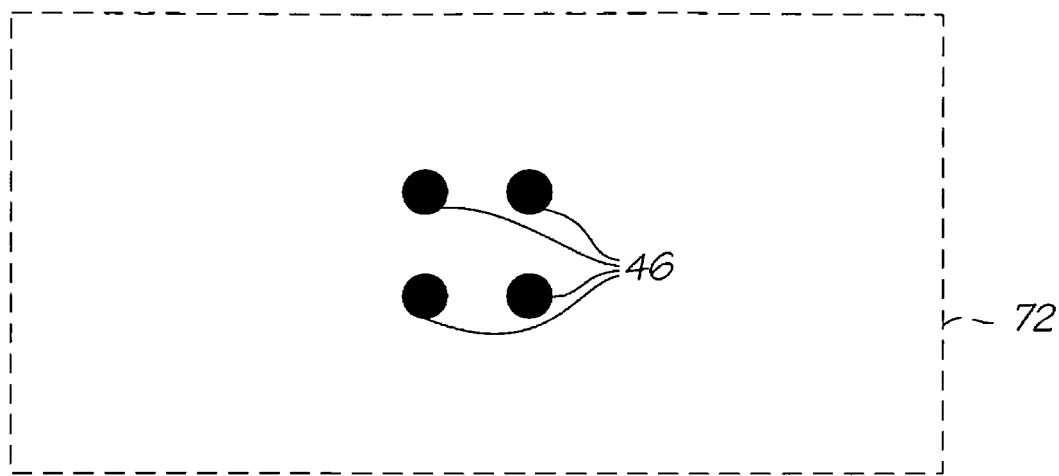
Figure 6:
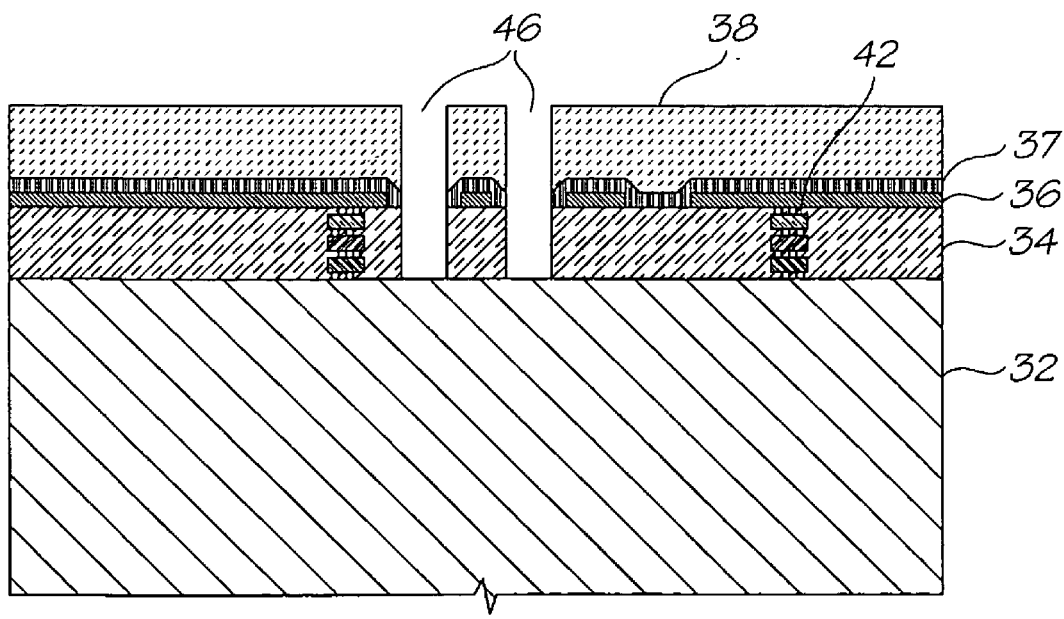
Figure 7:
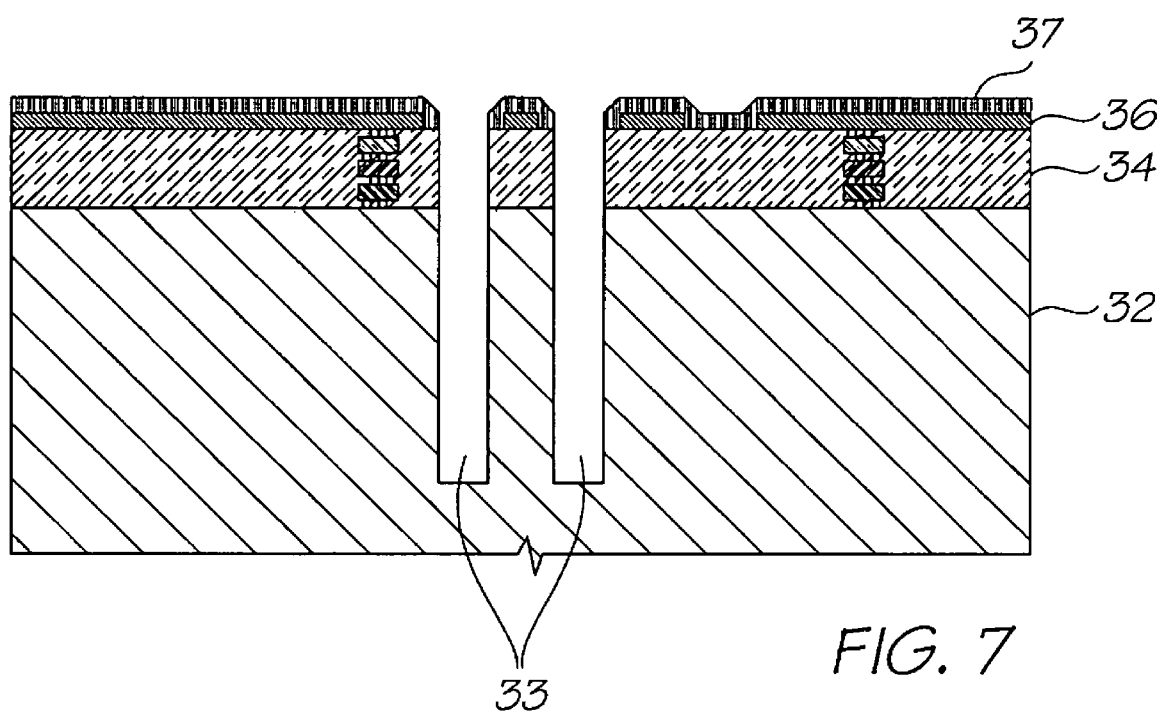

As shown in FIG. 6, a passivation layer 37 and sacrificial layer 38 are deposited next. This is followed by masking and etching through to the silicon substrate 32. This etch is known as the dielectric etch and the associated mask 72 is shown in FIG. 5. The mask represents the regions 46 that are etched. Following the dielectric etch, the sacrificial layer 38 is etched away with a different etchant which also etches the holes 33 deeper into the wafer substrate 32 (see FIG. 7).

Figure 8:
Figure 9:
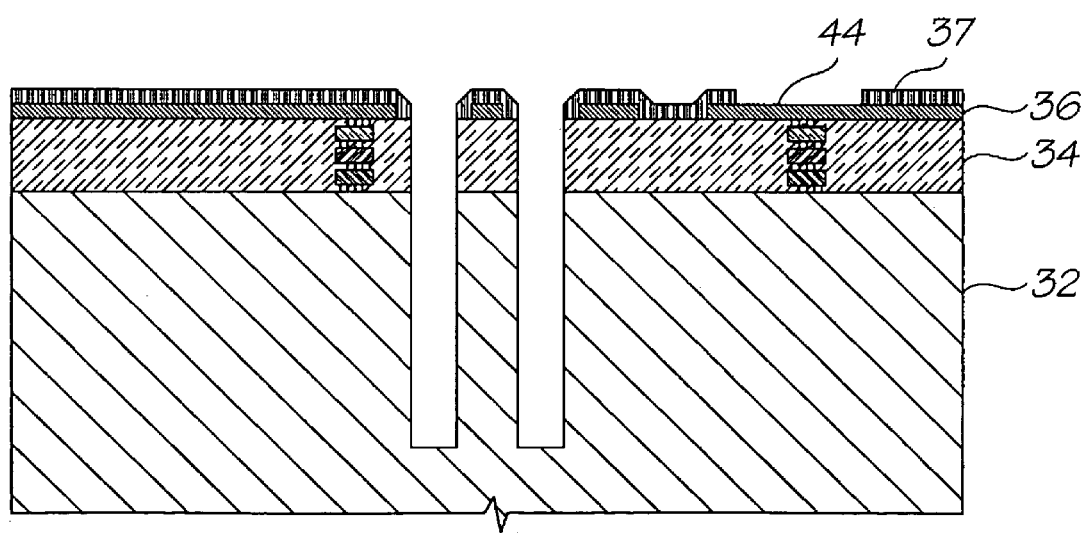

Referring to FIGS. 8 and 9, the passivation layer 37 is then etched in a region 44 above the upper contact to provide an electrical pathway for the second electrode (subsequently deposited).

Figure 10:
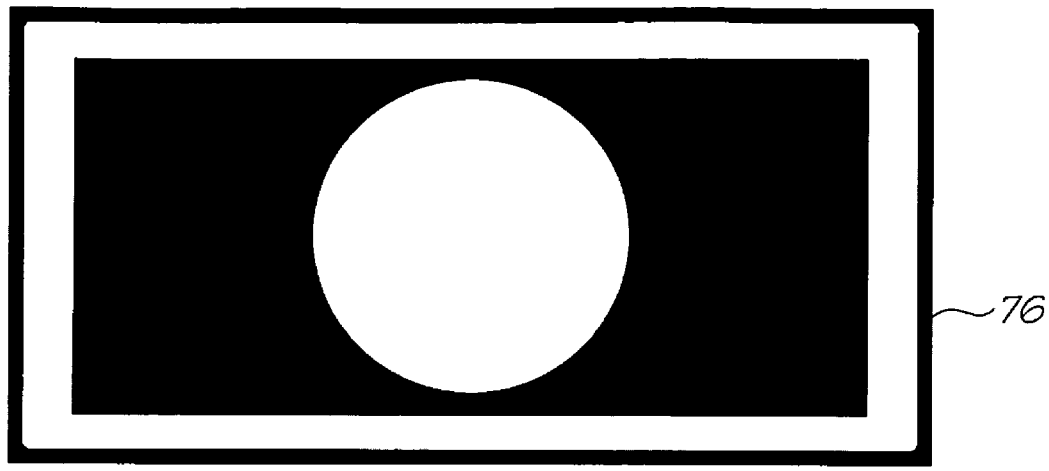
Figure 11:
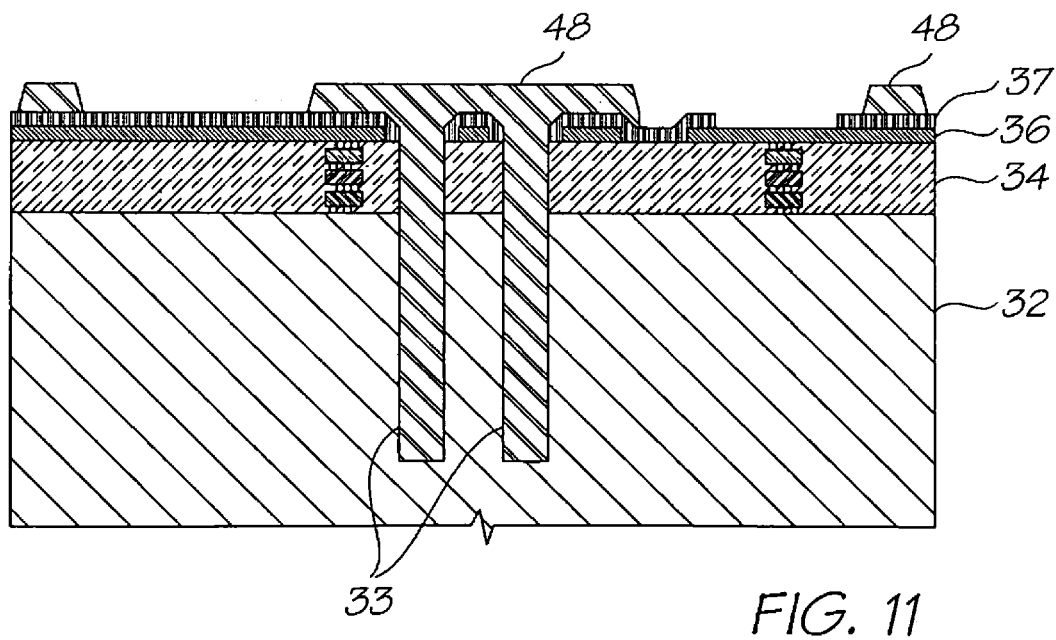

As shown in FIG. 11, sacrificial material 48 is then deposited to fill the openings 33 into the silicon 32 made by the dielectric etch. This deposition continues until the top of the sacrificial layer 48 is level and at a height which provides the requisite gap height between the top and bottom electrodes. The first sacrificial layer 48 is then patterned and etched. The associated mask 76 is shown in FIG. 10.

Figure 12:
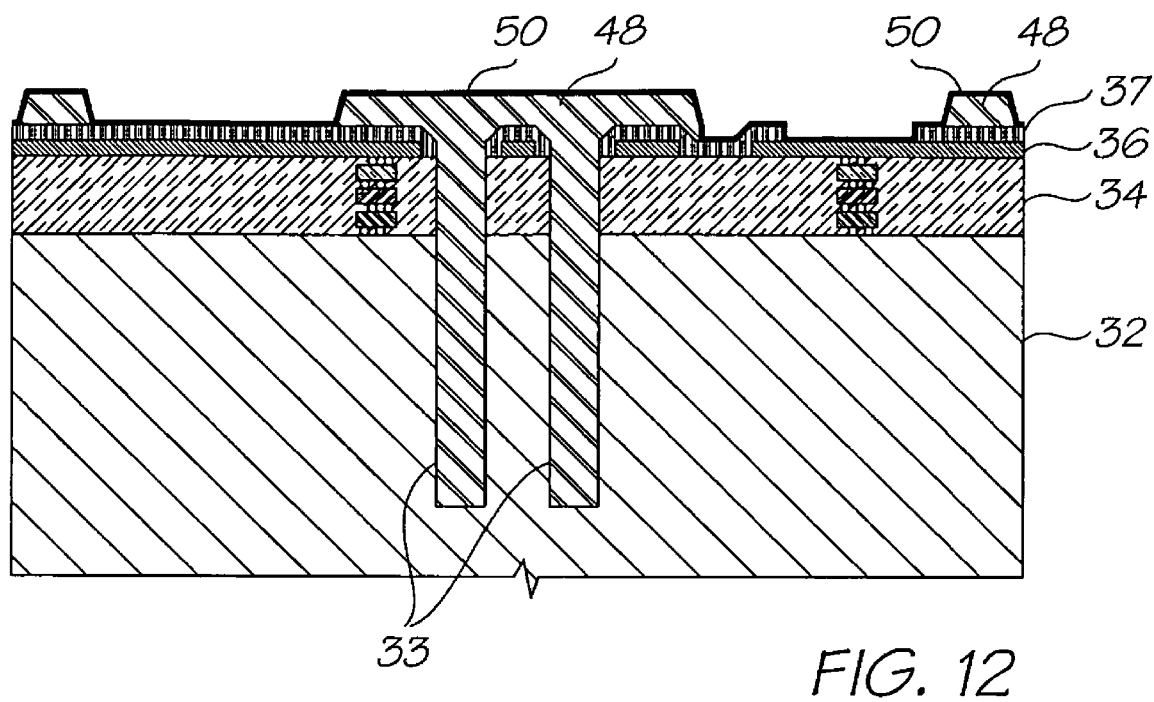
Figure 13:
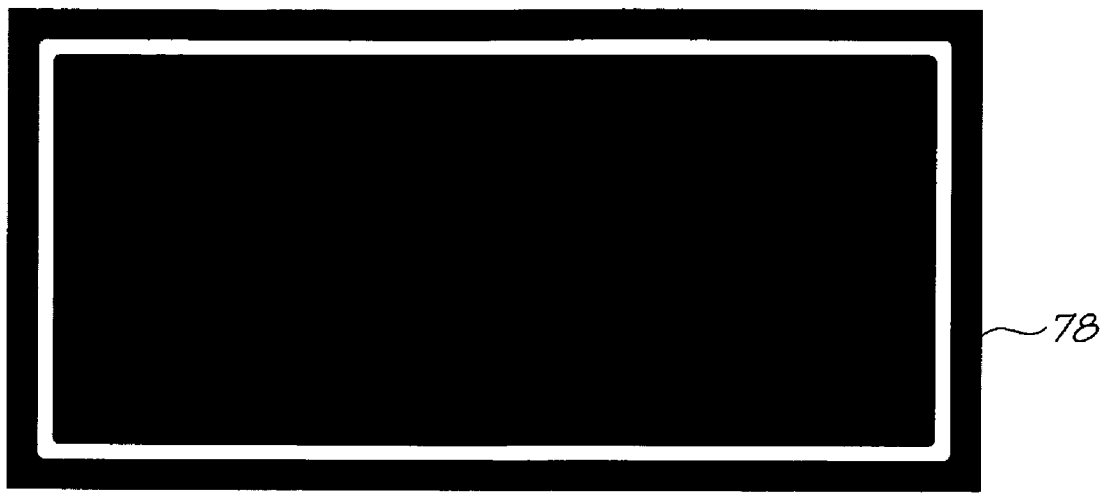
Figure 14:
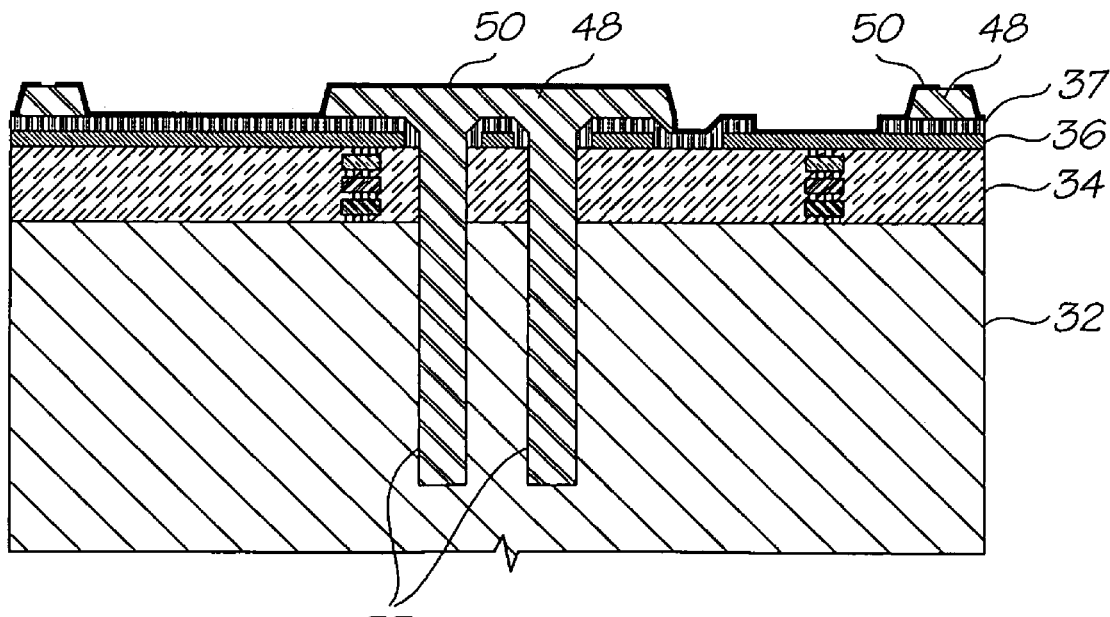

FIG. 12 shows the deposition of the upper electrode layer 50, also called the second metal layer. This layer is etched with the mask 78 shown in FIG. 13, with the blank regions being removed by the etch (see FIG. 14). The upper electrode layer 50 becomes the flexible membrane in the finished sensor.

Figure 15:
Figure 16:
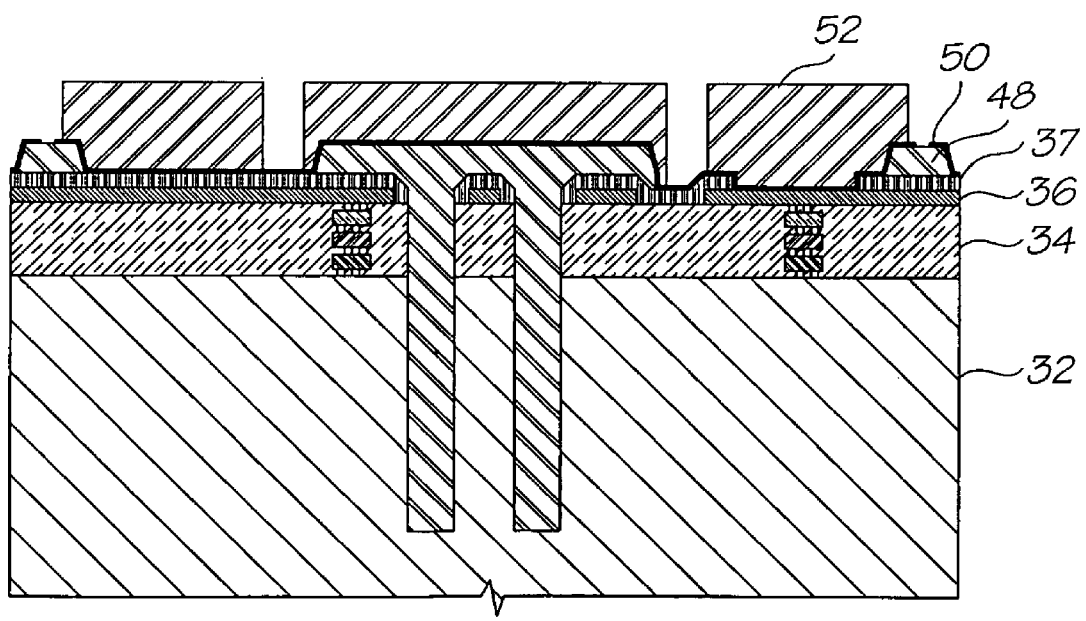

A second sacrificial layer 52 is then deposited (see FIG. 16), and subsequently etched. The relevant mask 80 is shown in FIG. 15.

Figure 17:
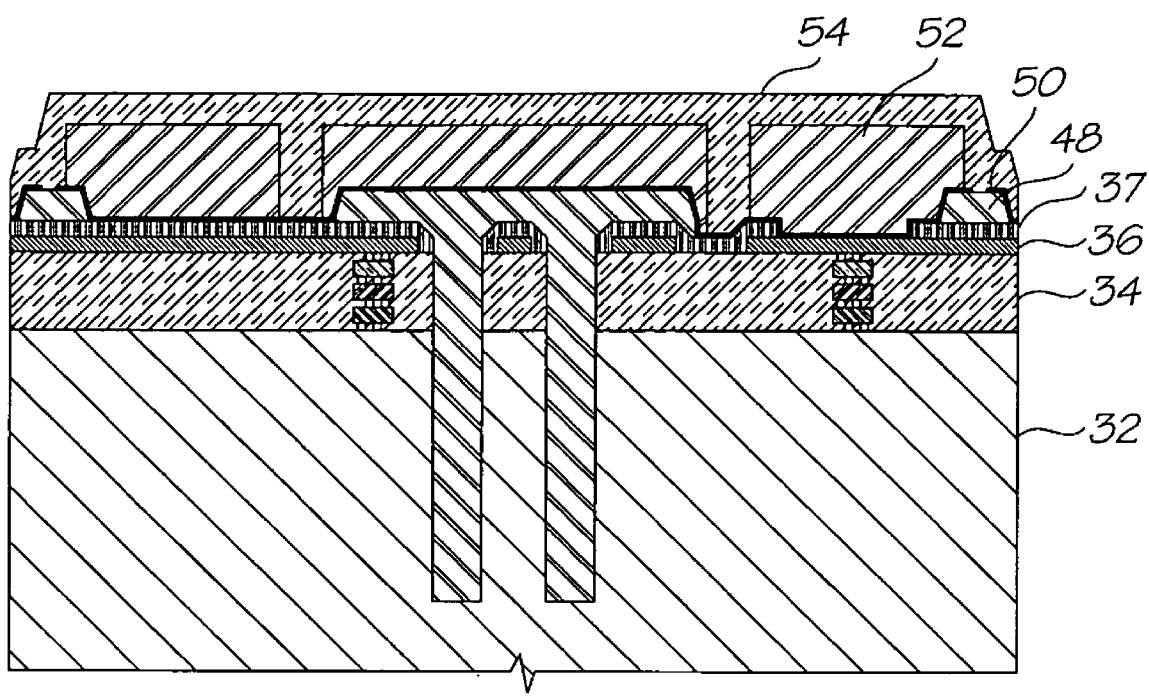
Figure 18:
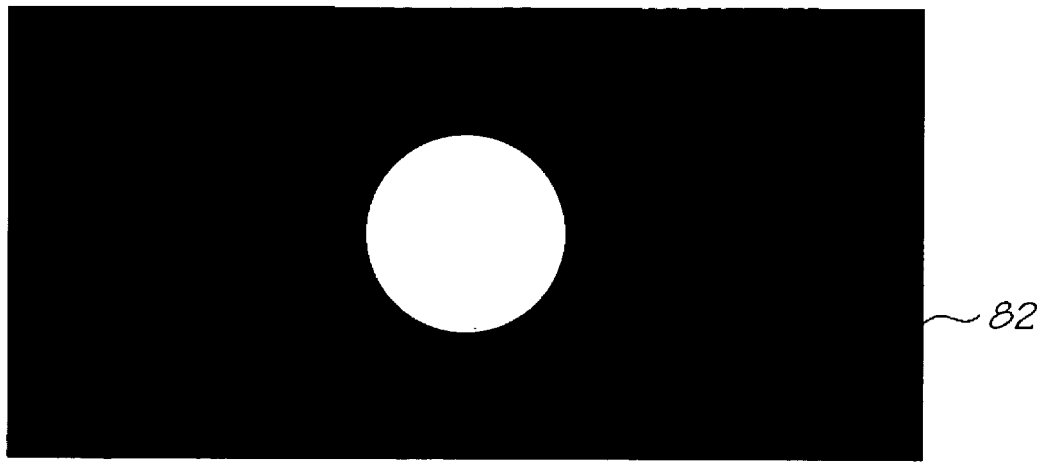
Figure 19:
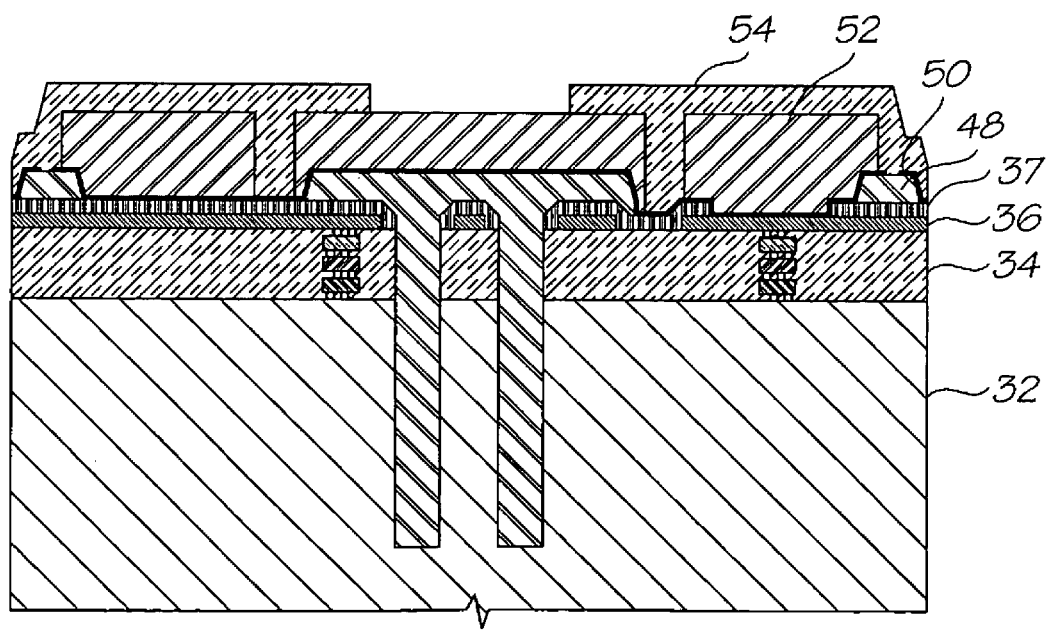
Figure 20:
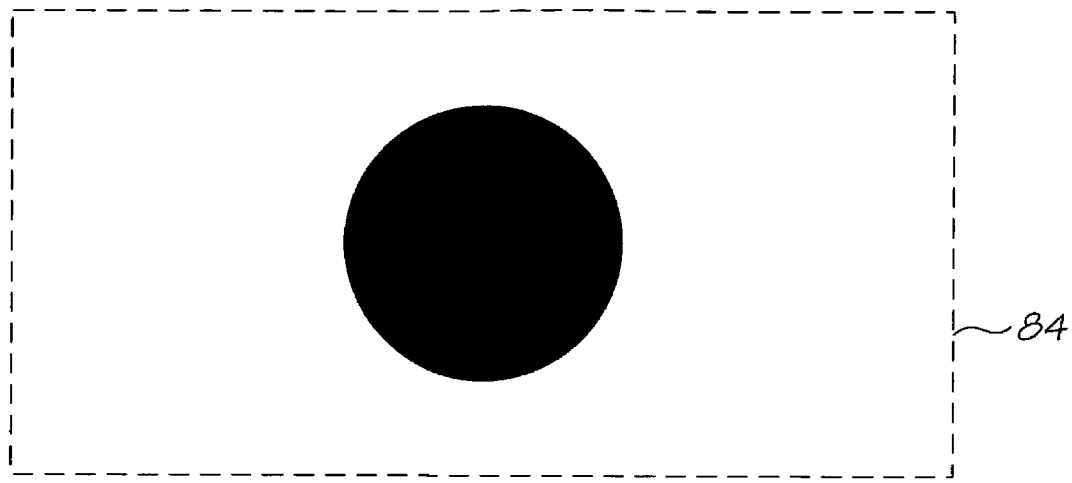

FIG. 17 shows the deposition of the roof layer 54. It is then etched using mask 82 shown in FIG. 18, with blank areas removed (see FIG. 19).

Figure 21:
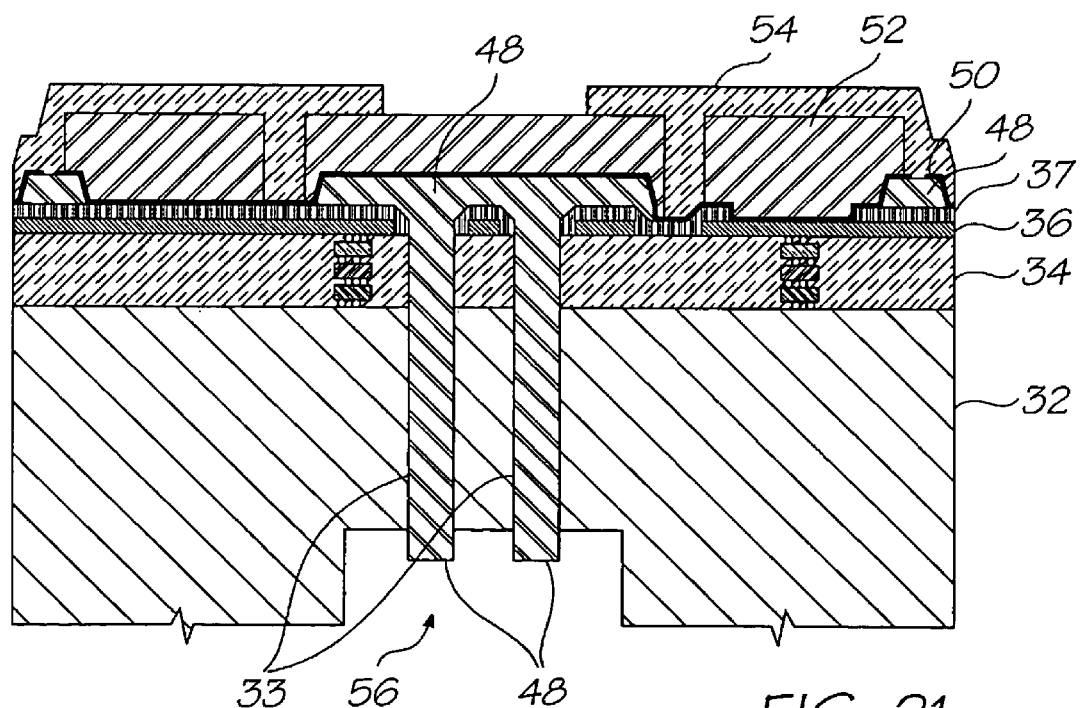
Figure 22:
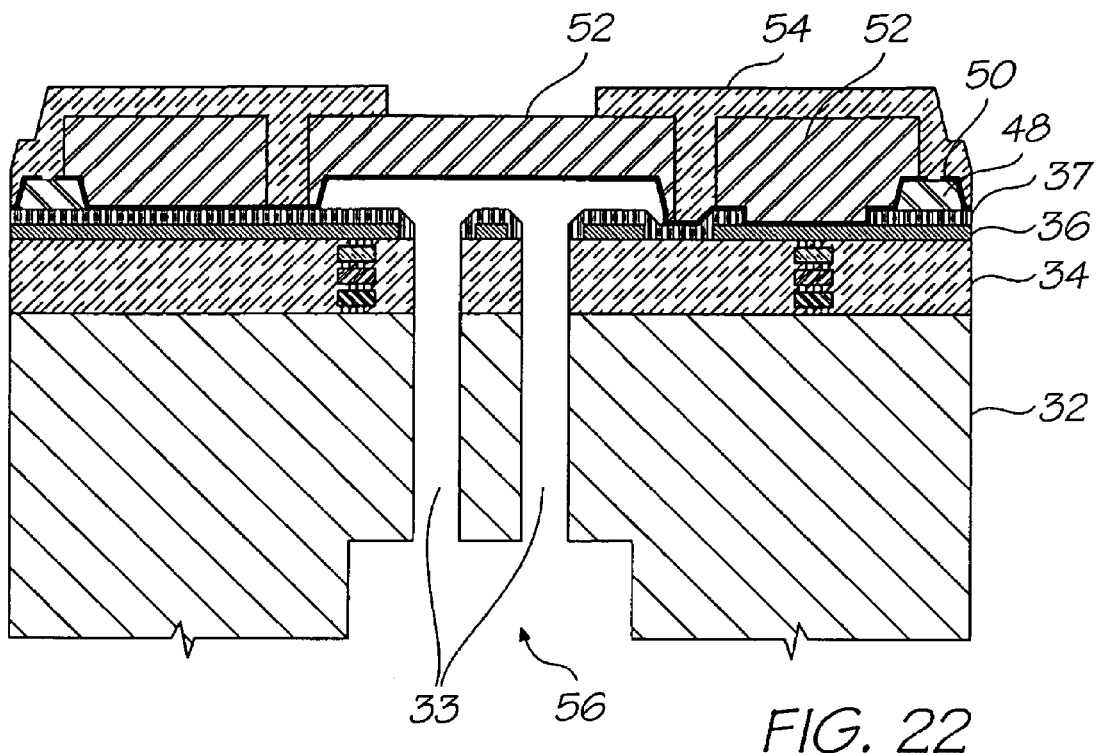
Figure 23:
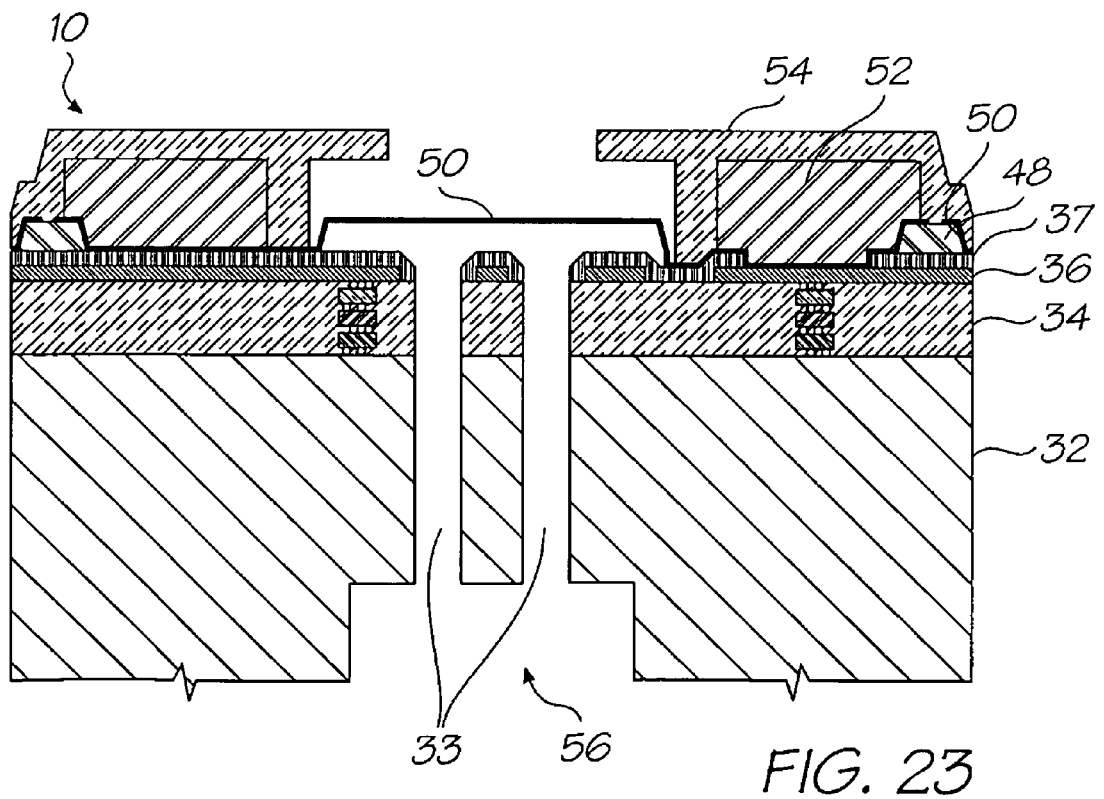

The wafer is subsequently turned over for 'back etching' from the reverse side of the wafer 32. FIG. 21 shows a deep back etch 56 extending through to meet the openings 33 in accordance with the mask 84 shown in FIG. 20. The openings 33 are filled with sacrificial material 48 which is exposed by the deep back etch 56. The sacrificial material is removed by plasma cleaning (see FIG. 22) through the deep etch 56.

As shown in FIG. 23, the wafer is again turned over and the sacrificial material 52 is removed through the hole in the roof layer 54. To complete the device, it needs to be packaged, with the bottom face of the wafer being sealed. Skilled workers will appreciate that there are various methods of achieving this. However, in the preferred embodiment, the bottom face of the wafer is sealed using wafer bonding, which is discussed in detail below.

Temperature Compensation

Differential thermal expansion of the components within the pressure sensor will affect the membrane deflection and therefore the sensor output. If the sensor is used in an environment with a large temperature variation, the sensor accuracy can become unacceptable. To address this, the pressure sensor can be coupled with a temperature sensor, with the pressure sensor then calibrated as a function of temperature.

Figure 24:
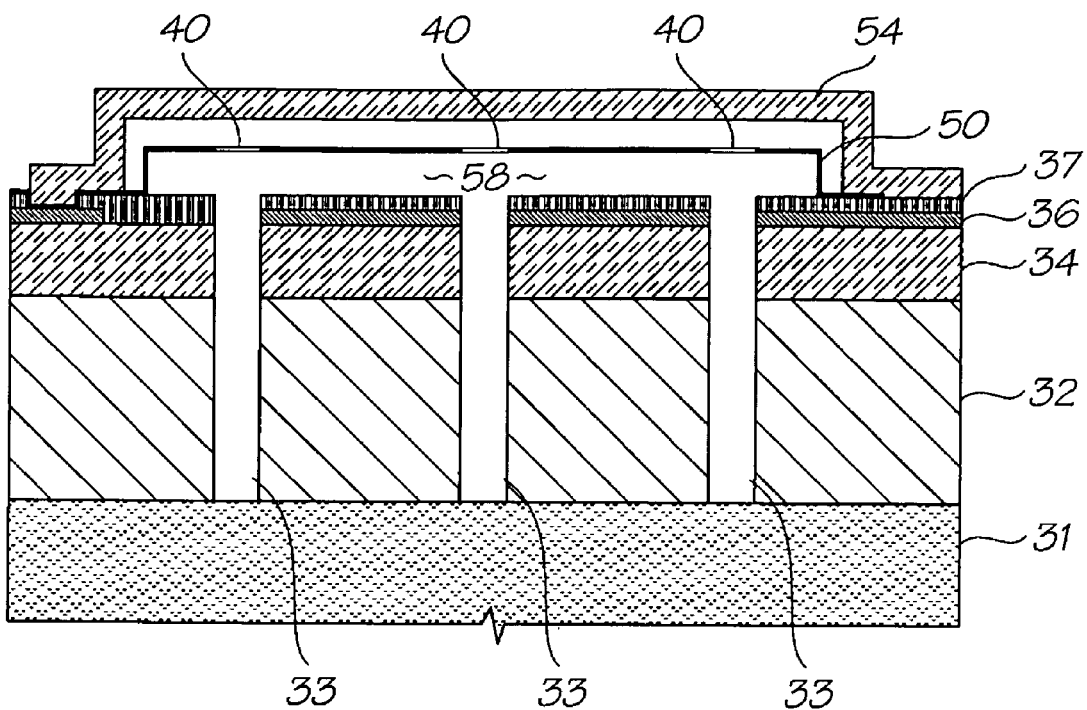
FIG. 24 is a schematic partial section of a reference sensor for providing temperature compensation for a sensor according to present invention.

To accommodate this, an embodiment of the present invention can conveniently incorporate a temperature sensor to account for temperature effects on the pressure sensor. A schematic section of the temperature is shown in FIG. 24. Reference chamber 58, can be etched into the same wafer substrate, but is not exposed to tire pressure like the adjacent pressure sensor (not shown). In these embodiments, the coupled sensors form an active and a reference sensor, the latter responding only to thermal changes. Skilled workers in this field will appreciate that the reference sensor can also serve as a temperature sensor with the addition of circuitry calibrating the capacitance to the temperature.

Referring to FIG. 24, the reference sensor is made in the same way as the active sensor, except that the holes 40 are made in the membrane 50 instead of the roof layer 54. The sacrificial material 52 between the membrane 50 and the roof layer 54 is removed with a back etch through the holes 40 in the membrane 50.

An alternative to this is to keep the membrane 50 intact and etch away the second sacrificial layer material 52 from above the active part of this layer, before deposition of the roof layer 54. This causes the membrane 50 to be bonded to the roof 54, and this configuration is much stiffer. Therefore, the exact dimensions of the reference sensor would need to be adjusted to provide a similar capacitance change in active and reference sensors due to thermally induced stress changes in the membrane 50.

Temperature Compensating Sensor Design

FIGS. 27a to 27h show perspectives of temperature compensating sensor at various stages of fabrication. As best shown in FIGS. 27(a) to 27(d), the reference sensor 51 is etched into the same wafer substrate 32 as the active sensor 53. This embodiment has further increased the structural strength by adding the top cover 60 over the roof layers 54 of the active and reference membranes. The cover 60 defines separate chambers 62 and 64 over the reference and active roofs 54 respectively. In this embodiment, the roof layers 54 of each sensor stop smaller particles from contacting the membranes 50. The top cover 60 provides much greater structural rigidity while protecting the membrane and roof guard layers 54 from damaging contact during installation. However, even with the top cover 60, the sensor has overall dimensions that are small enough for installation in the tire valve or valve stem.

As best shown in FIG. 27c, chamber 62 is sealed from the tire pressure, whereas chamber 64 is exposed to the tire pressure via vent 66 and channel 68. While it has not been shown in the figures, it will be appreciated that the vent 66 extends through to the back surface of the wafer substrate 32, where it is not sealed, but open to the tire pressure. If the sensor is wafer bonded to a sealing wafer (as discussed below), the sealing wafer has corresponding holes for establishing a fluid connection with the tire pressure.

Semiconductor Fabrication Techniques

Using the lithographically masked etching and deposition procedures of semiconductor fabrication, it is possible to manufacture a robust, low cost tire pressure sensor from Micro-Electro-Mechanical (MEM) based devices for use in a TPMS. The membrane can be formed from a material that is capable of withstanding a wide range of environmental conditions. An advantage of such a tire pressure sensor is the relatively low cost of manufacture. The membrane can be formed in many possible geometries, for example, as a generally flat or planar shape such as a disc, or having a featured surface.

Sensor Circuitry

Figure 26:
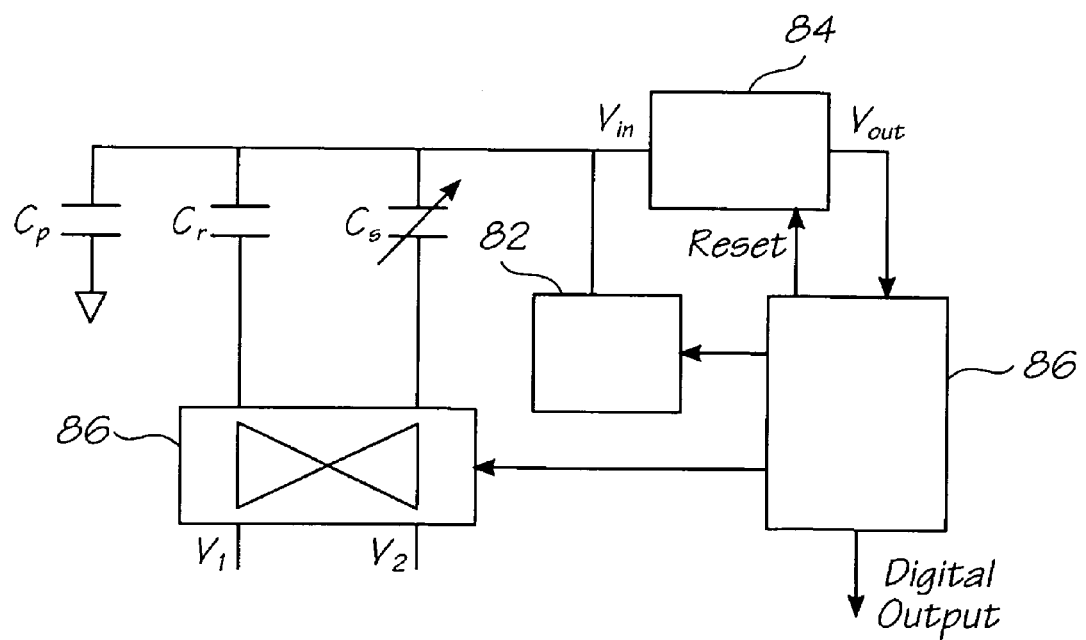
FIG. 26 is a diagrammatic representation of the sensor circuit.
Figure 27A:
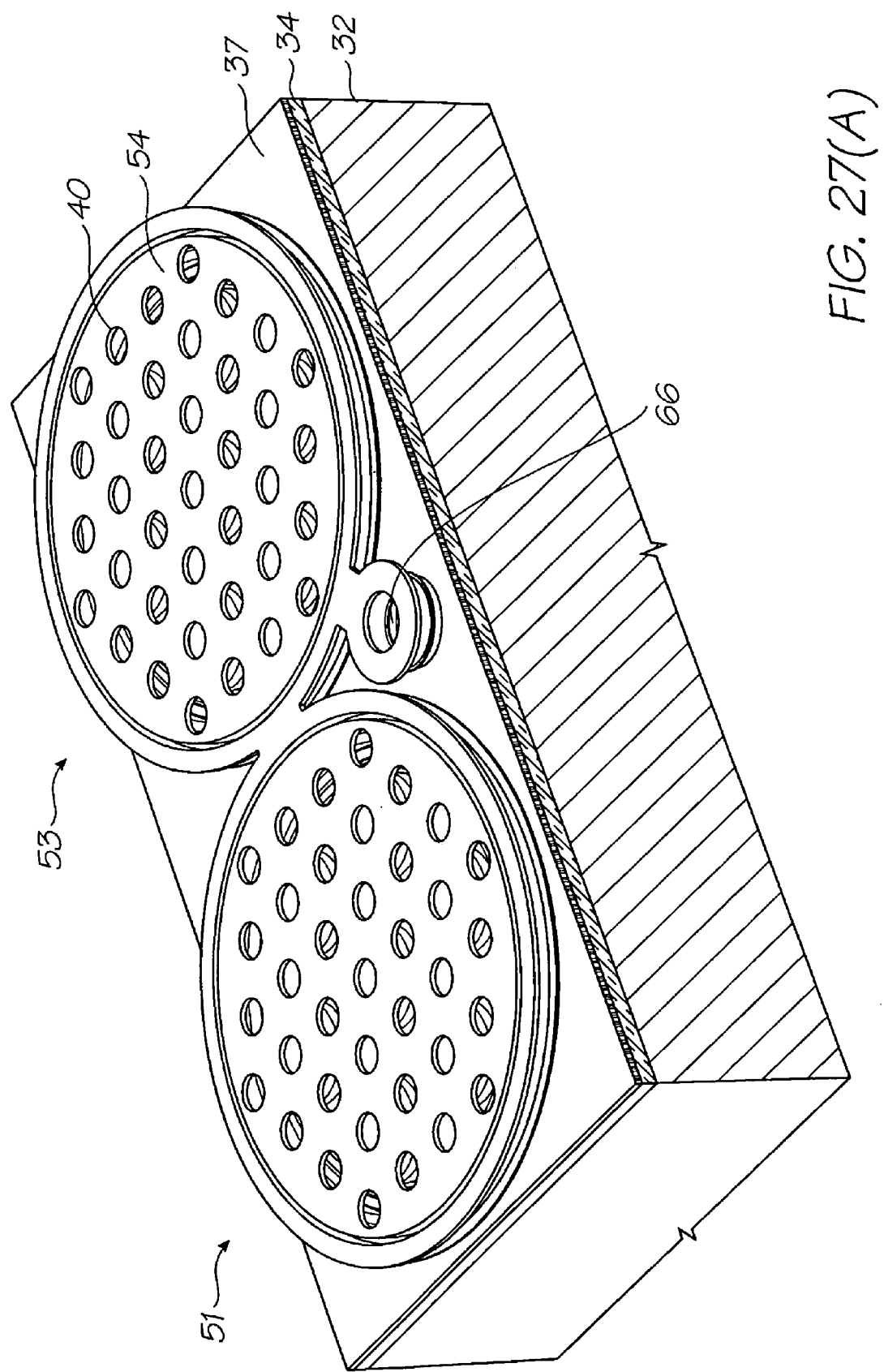
Figure 27B:
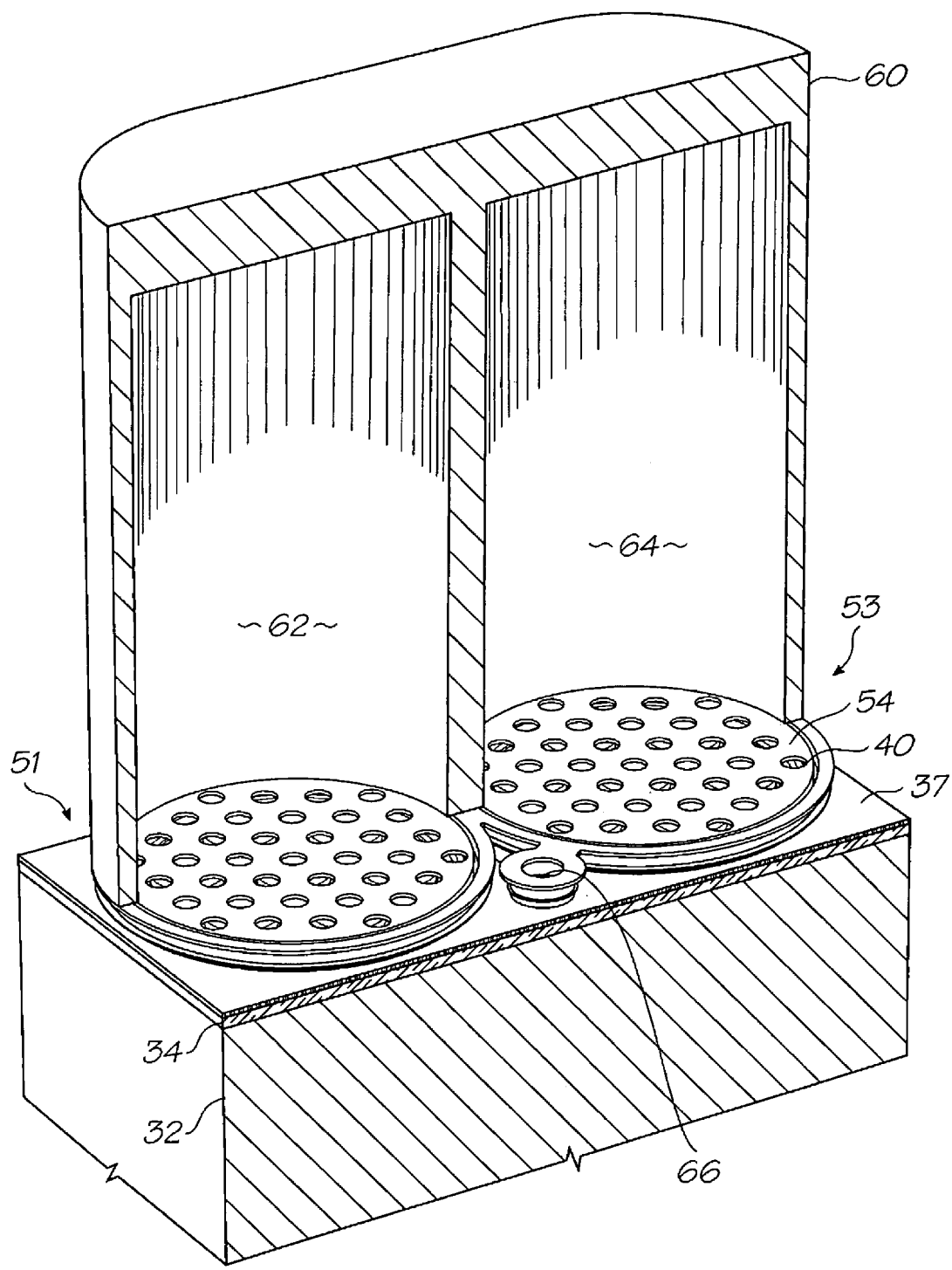
Figure 27D:
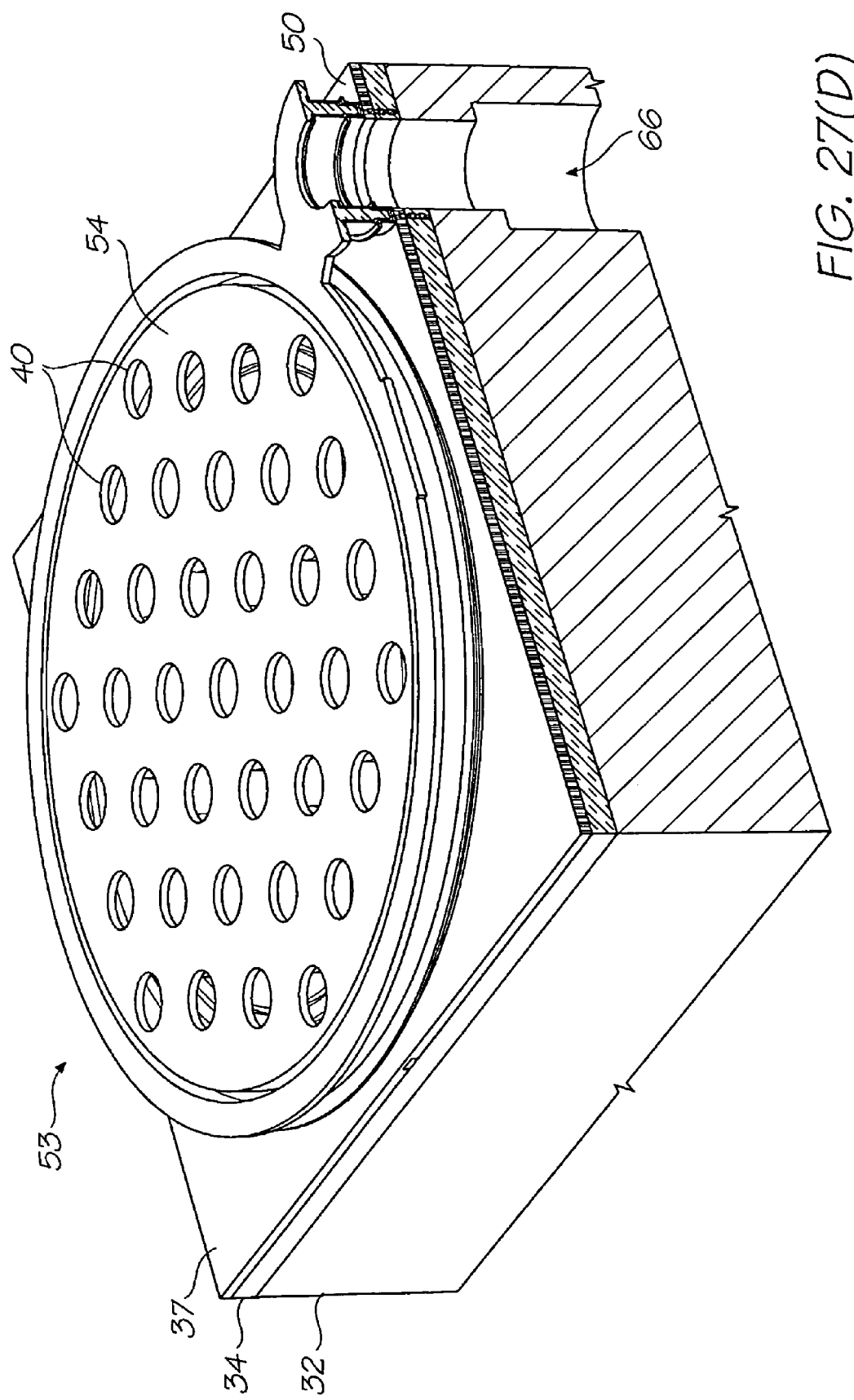
Figure 27E:
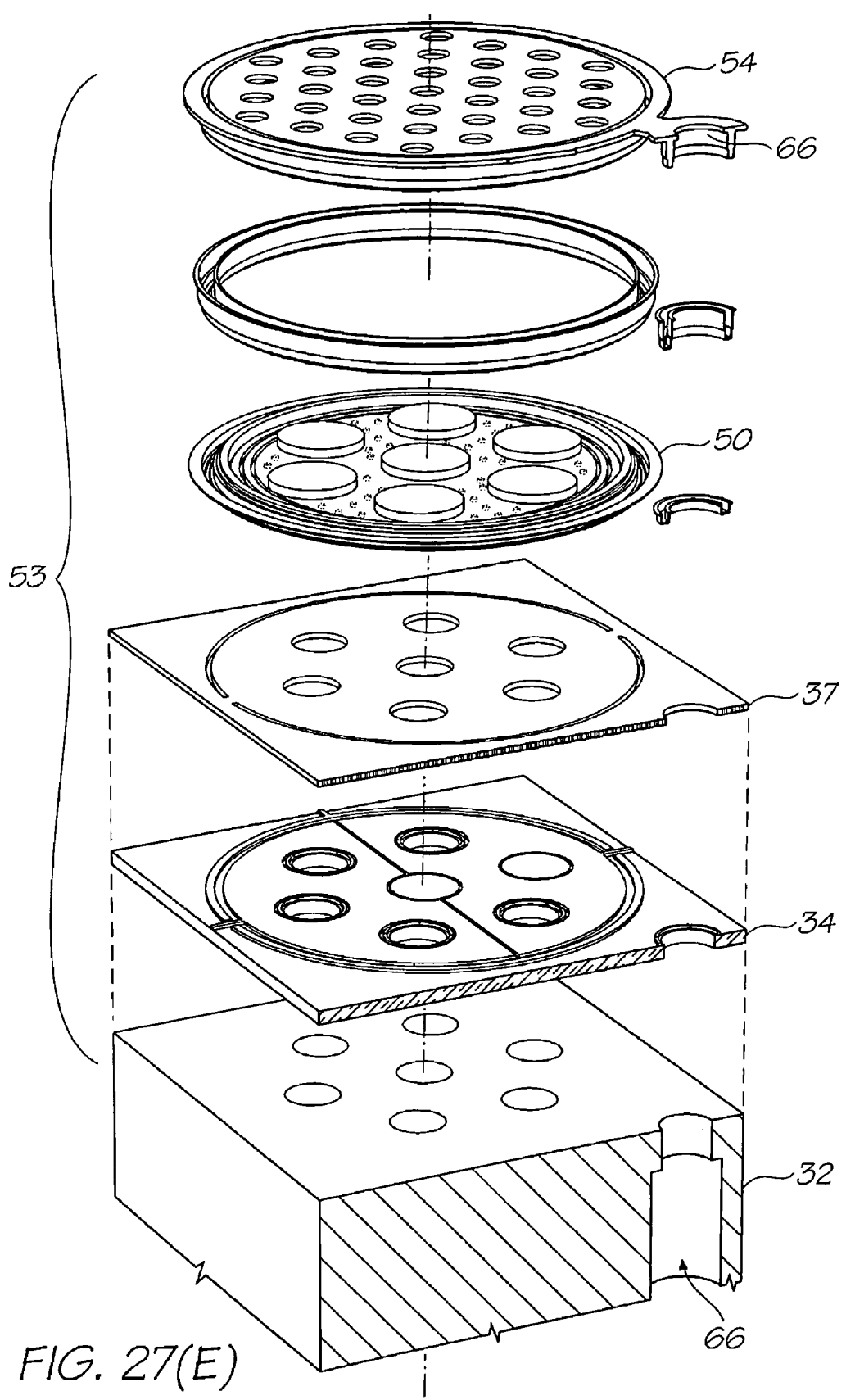
Figure 27F:
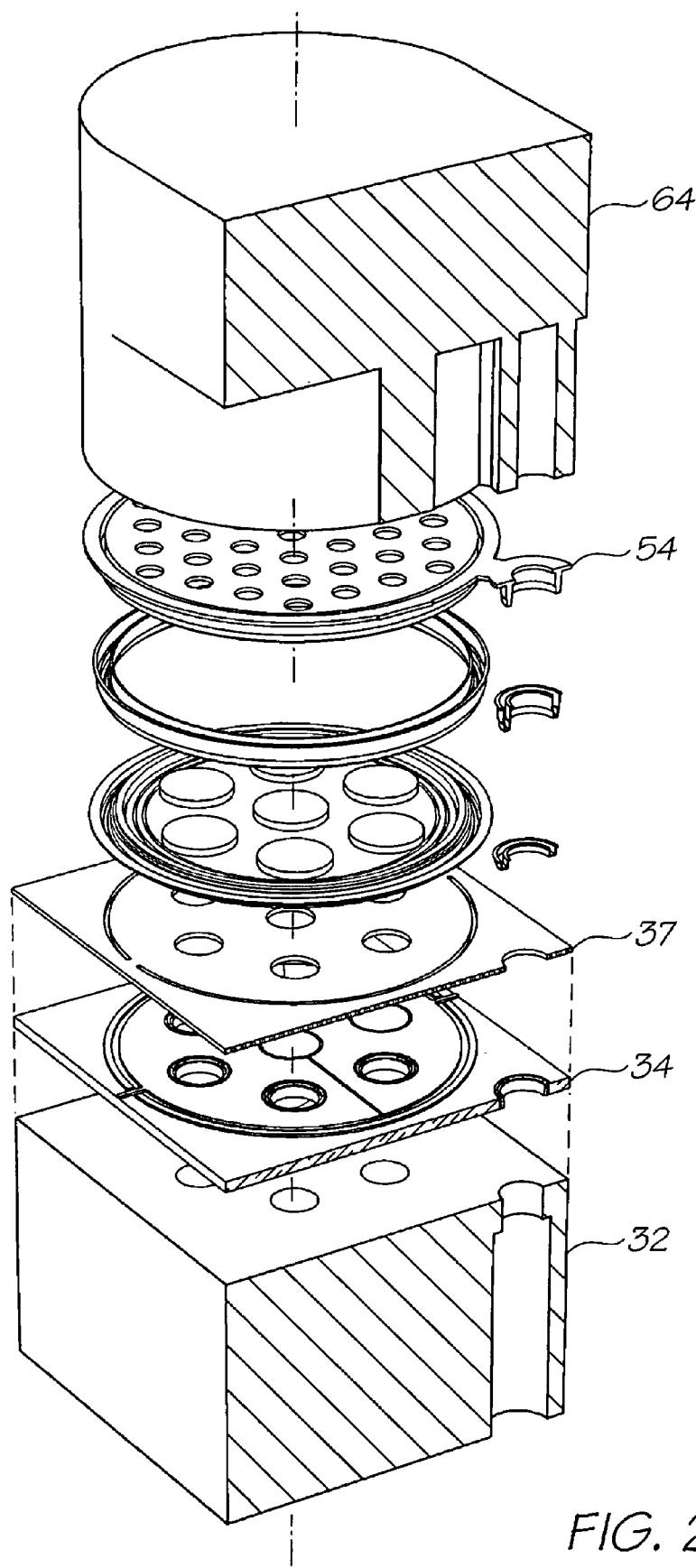
Figure 27G:
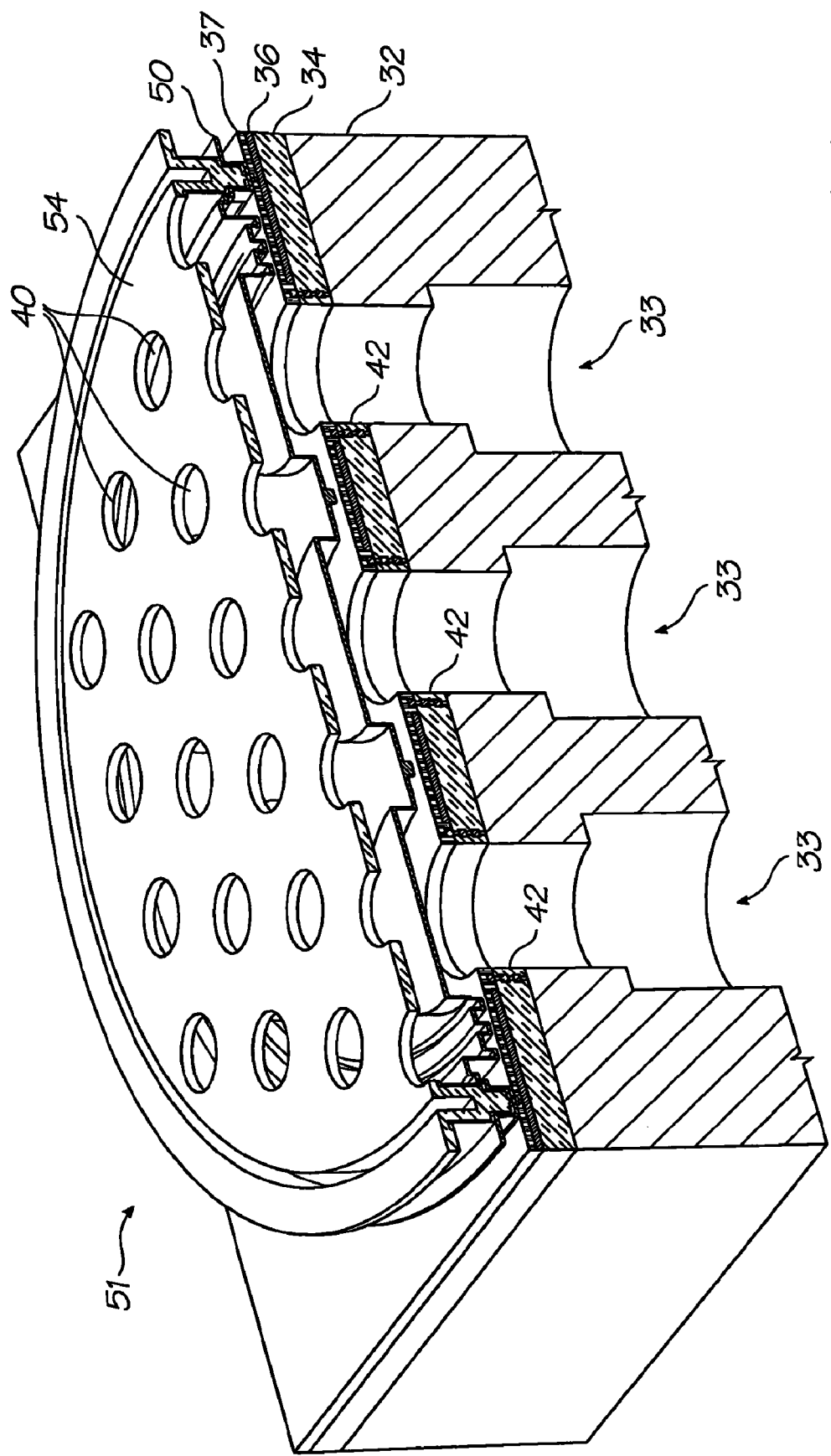
Figure 27H:
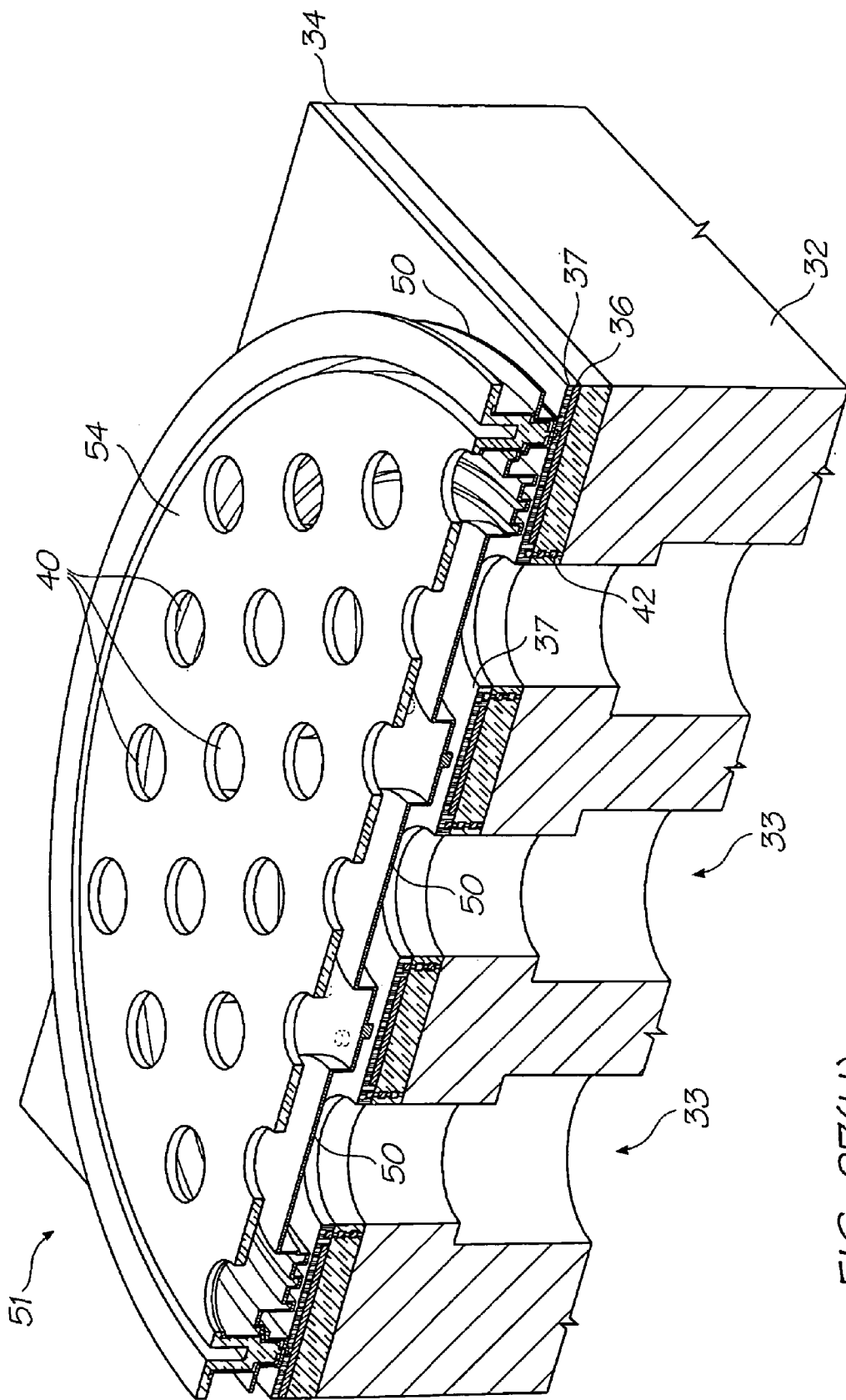

FIG. 26 is a diagrammatic representation of a capacitance sensing circuit where:

$C_s$ is the capacitance of the sensor capacitor;

$C_r$ is the capacitance of the reference capacitor (preferably made in the same way as sensor capacitor but non-sensing); and $C_p$ is a parasitic capacitance to ground.

V1 and V2 are constant voltages reference voltages provided to switches 80. These may be chosen to be two of the circuit power supplies or internal regulated supplies. These voltages are then switched onto one of each of the capacitor plates charging or discharging them. The voltage $V_{in}$ is fed to charge amplifier 84, a high gain device, which amplifies the voltage to $V_{out}$. $V_{in}$ provides a measure of charge imbalance in the circuit when it is operated as follows:

Step 1.

Connect $C_r$ to V2, $C_s$ to V1; reset the charge amplifier 84 which forces $V_{in}$ to a fixed voltage $V_r$ and set the charge injector to a know state with charge $Q_{I1}$.

The total stored charge, $Q_1$, is:

$$Q_1 = C_r(V2-V_r) + C_s(V1-V_r) + Q_{I1}$$

Step 2.

Connect $C_r$ to V1, $C_s$ to V2, and remove the reset from the charge amplifier 84. The output from the charge amplifier 84 is monitored by the control 86 and feedback applied to the charge injector such that the total charge is balanced forcing $V_{in} = V_r$ by injecting a charge of $Q_{I1} - Q_{I2}$.

The total stored charge, $Q_2$, is given by:

$$Q_2 = Cr(V1-V_r) + C_s(V2-V_r) + Q_{I2}$$

Feedback forces $Q_1 = Q_2$, so that the digital output from the control 86 is:

$$Q_{I1} - Q_{I2} = (V1-V2) \cdot (C_r - C_s)$$

The control logic 86 may operate an iterative procedure to determine the required output to obtain this charge difference, at the end of which it will produce the required digital output.

The voltage on $C_p$ is the same at the end of Step 1 and Step 2, and so ideally, does not contribute to the digital output.

Optionally, these steps can be repeated and an averaging applied to the digital output to reduce random noise. Furthermore, additional steps may be added to the above idealized case, in order to improve accuracy of the circuit.

Sensor Installation and Power Supply

FIGS. 25a to 25d schematically show the installation of the sensor within the valve stem of a car tire. The pressure sensor can be mounted in other locations including the valve head, the tire wall, the wheel hub and so on. However, the relatively solid structure of the valve stem makes it the most convenient component for automated installation of the sensor. Furthermore as the stem closer to the centre of the wheel than the rest of the tire, the acceleration forces on the sensor generated by wheel rotation are less.

As best shown in FIGS. 25b and 25c, the sensor 96 is mounted in the valve stem 92. A small recess is created in the valve stem wall 94. A thin layer of hard-setting adhesive 98 is applied as a coating on the recess walls. The sensor chip 96 is then adhered into the recess with any excess adhesive removed before the adhesive 98 is cured.

Power can be supplied to the sensor chip 96 in a number of fashions, including, but not limited to, a long-life battery (not shown) located in the valve stem wall 94, a long-life battery located in the valve head 92, or radio frequency energy beamed to an electromagnetic transducer from an external station. The embodiment shown in FIGS. 25a to 25d is the latter. The pressure and temperature are sampled once per second, or at any other rate as required by legal or commercial obligations, and the results are displayed on the dashboard tire sensor display 106, marked as level monitors 104. If the tire pressure is outside the levels specified by the tire manufacturer for proper tire functioning, or indeed any other limits which arise from legal or commercial obligations, the specific tire 90, or tires, will have an error shown in colour (e.g. red) on the car chassis symbol 102.

If the power is supplied to the sensors 96 by long-life batteries, the sensor display 106 would include a low battery indicator. This can be conveniently by illuminating the problem signal 102 in a different colour (e.g. purple).

Low Mass/Conductive Ceramic Membrane

In a particular embodiment, the sensor has a membrane that is at least partially a conductive-ceramic compound, for example, titanium nitride, TiN. The use of MEMS-based sensors reduces the effects of acceleration due to the greatly decreased mass. As an illustrative but non-limiting example, a TiN membrane, with density of 5450 kgm$^{-3}$, radius of 50 μm and thickness of 0.5 μm, should experience a force of 0.2 μN due to an acceleration of 1000 g; compared with a force of 1.6 mN for a pressure of 207 kPa (approximately 30 psi), which is typical for standard tire inflation pressure. The low mass of the membrane ensures that the affect of acceleration is negligible compared to that of the pressure.

TiN has been found to have a surprisingly high yield strength compared with other known materials used for capacitive sensor membranes. This makes it suitable for use in a wider range of stressful, harmful or dangerous environments. This also means that under standard conditions, membranes made from TiN should have greater lifetimes compared with standard capacitive pressure sensors.

The sensor membrane may be composed of other conductive-ceramic compounds. In particular, metal-ceramics, for example titanium aluminium nitride (TiAlN), titanium aluminium silicon nitride (TiAlSiN), tantalum nitride (TaN), tantalum aluminium nitride (TaAlN) or the like, have suitable properties. These metal ceramics are hard wearing and form a tough, thin surface oxide. The protective oxide gives the sensors good robustness and longevity. Metal ceramics are well suited to deposition by semiconductor fabrication techniques. This allows the sensor to have a thin membrane (0.5 μm to 5 μm) with diameters ranging from about 20 μm to 2000 μm. As discussed below, thin membranes have less internal stresses from rapid cooling, and less mass for limiting acceleration effects.

Squeeze Film Damping

According to another possible embodiment, an electrode in the sensor can be provided with holes to prevent squeeze film damping. Squeeze film damping occurs when the membrane deflects very close to the static electrode. The pressure of the fluid between the membrane and the static electrode rises and restricts, or damps, the membrane motion. This can severely restrict the dynamic response of the membrane.

Channels or apertures can let the fluid between the fixed electrode and the dynamic electrode (membrane) flow away from the narrowing space between them. The fluid must still remained sealed within the sensor, however, letting it escape from between the opposing faces of the membrane and the fixed electrode avoids squeeze film damping effects.

Internal Stresses

Residual stress in the membrane can affect its deflection and therefore the accuracy of the sensor. The fabrication process is a typical cause of residual stress. Rapid cooling material from an elevated temperature, can generate thermal stresses in proportion to the material co-efficient of thermal expansion. These stresses can deform the membrane and change its deflection characteristics under fluid pressure. This in turn can affect the accuracy of the pressure reading.

As discussed above, masked lithographic deposition of the conductive-ceramic membrane allows it to be very thin— typically of the order of 0.5 μm thick. The temperature profile across the thickness of a thin membrane is much flatter than that of a relatively thick membrane. The membrane cooling is far more uniform and the internal stresses are largely eliminated.

Laminated Membrane

Masked lithographic deposition also allows the sensor to have a relatively thick membrane for harsh operating conditions, while still avoiding the problems of residual thermal stresses. By forming the membrane as a laminate, the separately deposited layers are individually thin enough to avoid residual stress but the final laminate is sufficiently strong.

Instead of depositing layers of the same conductive material, the individual layers can be selected so their collective properties provide good resistance to harsh environments. For example alternate layers of TiN or TiAlN or various other combinations of metals and ceramics, for example, Ti and TiN.

Laminated Roof Layer

Likewise the roof layer 54 may also composed of several different material layers, for example, silicon nitride, $Si_3N_4$, and silicon dioxide, $SiO_2$. Again, this avoids residual thermal stresses.

Simulation Results and Analysis

To permit an examination of the performance of a TiN membrane capacitive sensor, a series of numerical simulations have been performed using a commercial finite-element modelling package called ANSYS 5.7 (http://www.ansys.com). Axisymmetric models were used to reduce computational time. This required a symmetry boundary condition at the centre of the membrane, whilst the edge of the membrane was held fixed. A square mesh with one thousand nodes distributed equally across the radius was employed, and meshes with half the number of cells exhibited less than 5% difference in the maximum stress and deflection.

As discussed above, a MEMS fabrication procedure can be used to deposit a 0.5 μm thick layer of TiN to form a membrane. A membrane deflection of 5 μm provides sufficient variation in capacitance. For a standard passenger vehicle, the pressure applied to the membrane is typically be in the range 0-45 psi, allowing for 50% tire over-inflation. According to linear theory (see Young, W. C. and Budynas, R. G., *Roark's Formulas for Stress and Strain*, 7$^{th}$ Edition, p 488, 2002), the membrane radius, R, for a specific deflection, Δ, and applied pressure, P, is given by:

$$R = \left\{ \frac{16\Delta E t^3}{3P(1-v^2)} \right\}^{1/4} \qquad (1)$$

where E is the modulus (approximately 500 GPa for TiN), t is the membrane thickness and ν is Poisson's ratio (0.25 for TiN). For these values it is found, from equation (1), that R ≈50 μm. The variation of membrane deflection with applied pressure is shown in FIG. 3 for a membrane radius of 50 μm.

The comparison between linear finite element model (FEM) and linear theory is quite good.

At very high pressure, the deflection-pressure response becomes non-linear, and it is important to include these non-linear effects when designing a working tire pressure sensor.

Non-Planar Membrane

Figure 28A:
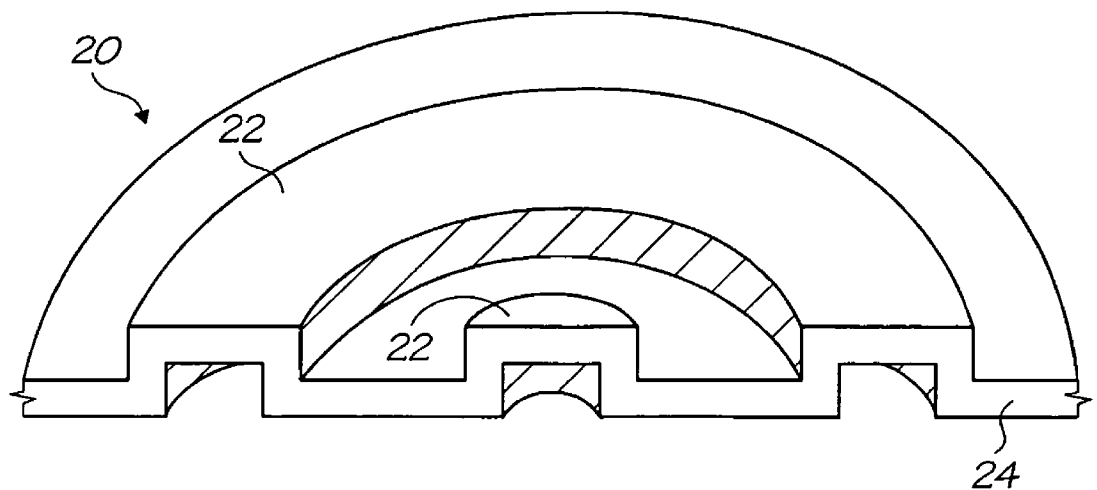
FIGS. 28A (perspective view) and 28B (side view) illustrate a schematic of a membrane with corrugations according to a possible embodiment of the present invention.
Figure 28B:
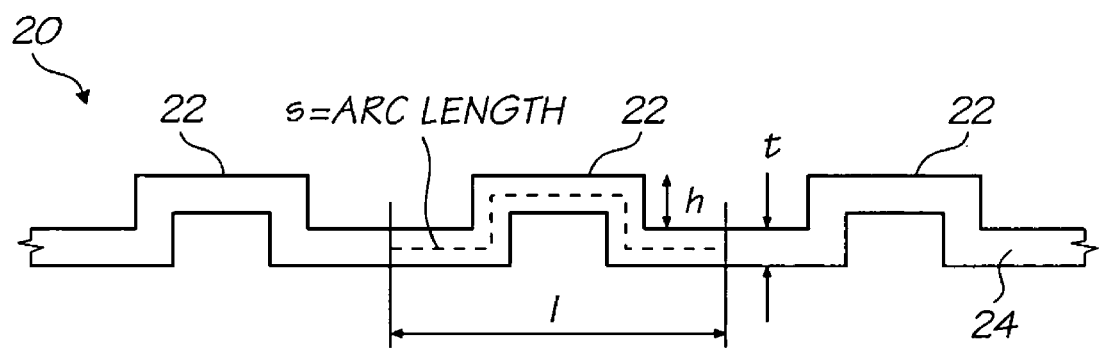

It is possible to extend the linear range of the device by corrugating the membrane. FIGS. 28a and 28b illustrate a possible embodiment of a non-planar membrane 50 for use in a TPMS sensor. The membrane 50 is generally circular in extent and is provided with corrugations formed as annular ridges 22 on a base region 24. The number and spacing of annular ridges, and the individual shape of the annular ridges 22, can vary. Also, differently shaped annular ridges 22 could be provided on a single base region 24. In the particular embodiment illustrated, the corrugations are formed to have a square-shaped cross-sectional profile. Geometric parameters s, l, H and t are also illustrated and are referenced in the following equations. For a circular membrane, this amounts to superimposing a series of raised annuli on the membrane profile as illustrated in FIG. 28b. A theoretical model for the non-linear response for a corrugated membrane is:

$$\frac{PR^4}{Et^4} = A_p\left(\frac{\Delta}{t}\right) + B_p\left(\frac{\Delta}{t}\right)^3 \quad (2)$$

where $$A_p = \frac{2(q+2)(q+1)}{3\{1-(v/q)^2\}} \quad (3)$$

$$B_p = \frac{32}{q^2-9}\left(\frac{1}{6} - \frac{3-v}{(q-v)(q+3)}\right) \quad (4)$$

and $$q = \frac{s}{l}\left\{1 + 1.5\left(\frac{H}{t}\right)^2\right\} \quad (5)$$

Figure 29:
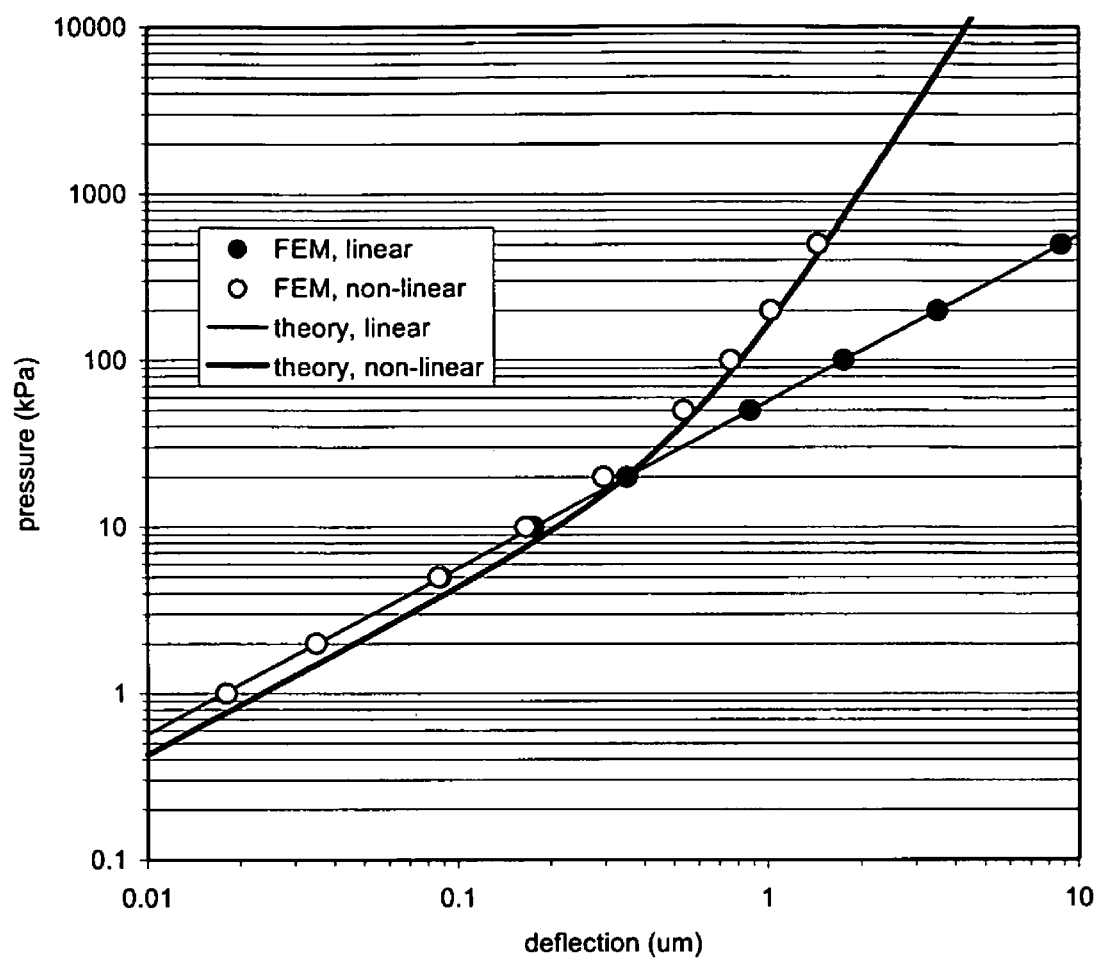
FIG. 29 illustrates a comparison of linear and non-linear theory with linear and non-linear finite element modelling for a flat circular titanium nitride (TiN) membrane, with R=50 μm and t=0.5 μm.

The variable q is referred to as the corrugation quality factor, s is the corrugation arc length, l is the corrugation period and h is the corrugation height (refer to FIG. 28b). For right-angled corrugations, s=l+2 h. For a flat membrane, q=1. To include non-linear effects in the finite element calculation, the load is applied over a number of sub-steps and an equilibrium solution is sought for each sub-step. The results for the non-linear simulation and theory are also shown in FIG. 29. The response becomes non-linear at approximately 30 kPa, which is well below the maximum expected tire pressure. The non-linear finite element simulations match the linear and non-linear theories below and above the critical point, respectively.

To assess the effect of corrugations on sensor designs, finite element models were constructed for two different corrugation periods, l=10 and 20 μm, and two different quality factors, q=4 and 8. This results in a corrugation height of approximately 0.65 and 1.0 μm for q=4 and 8, respectively. The results in FIG. 30 indicate that it is necessary to include non-linear effects for the pressure range considered here; non-linearity should also be present due to the large number of rigid corners in the model.

Figure 30:
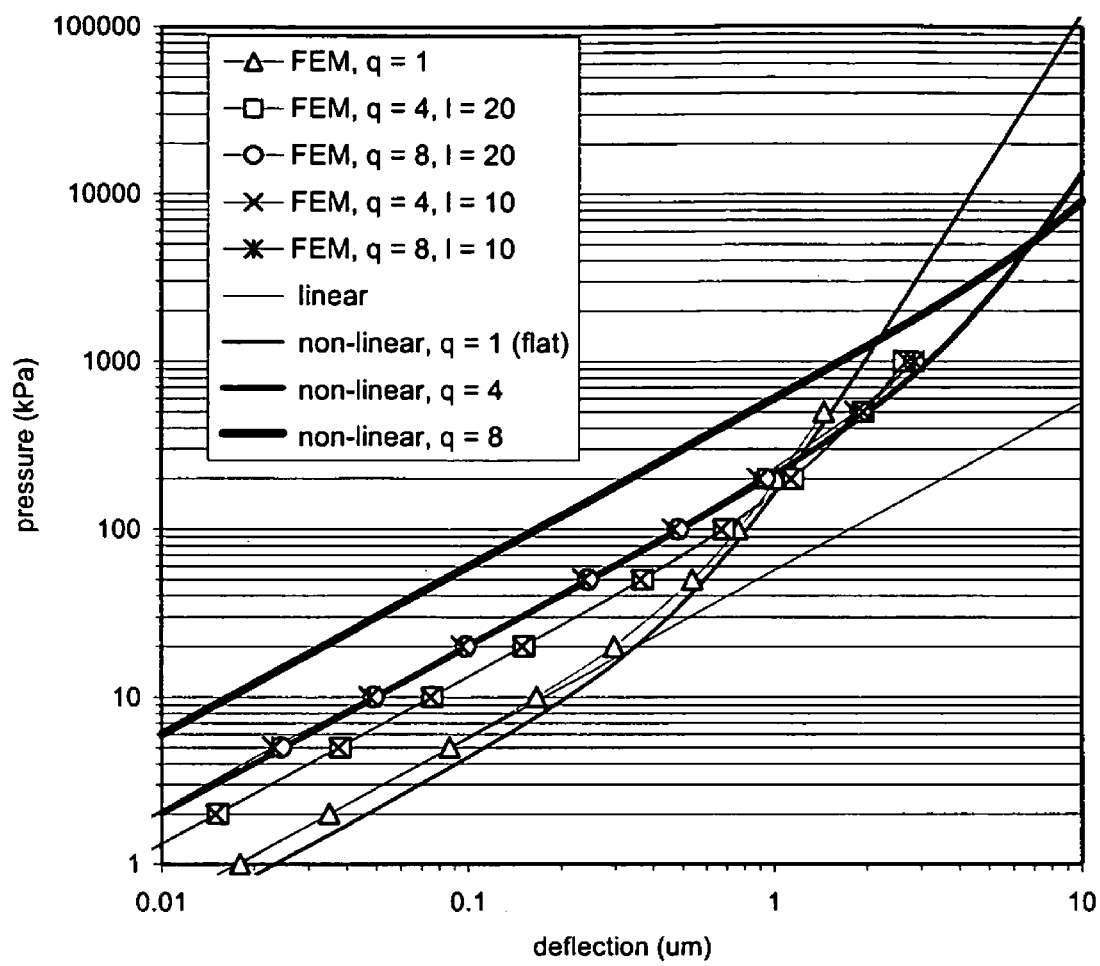
FIG. 30 illustrates the effect of membrane corrugations on pressure-deflection sensitivity.

The results of the finite element simulations are compared with the theoretical model in FIG. 30. This shows that a corrugation factor of 8 will extend the linearity of the sensor up to an applied pressure difference of approximately 1 MPa. It also shows that the corrugation period does not have a strong effect for the configurations examined herein.

Figure 31:
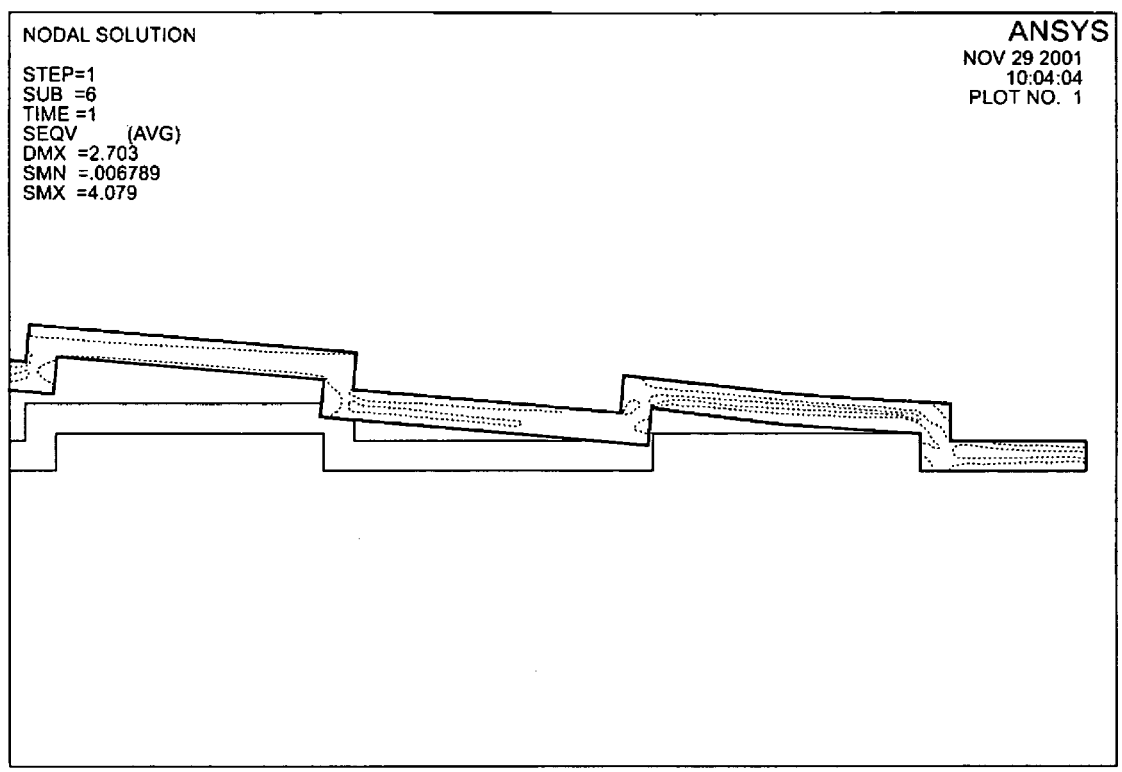
FIG. 31 illustrates an expanded view of Von Mises Stress distribution near an edge of a membrane, with p=1 MPa, q=4 and l=10 μm.

The maximum Von Mises stress behaves in a similar manner to the membrane deflection. The stress is concentrated near the junction at the lower side of the outermost corrugation with progressively less stress on the inner corrugations (see FIG. 31 for a typical stress distribution).

Figure 32:
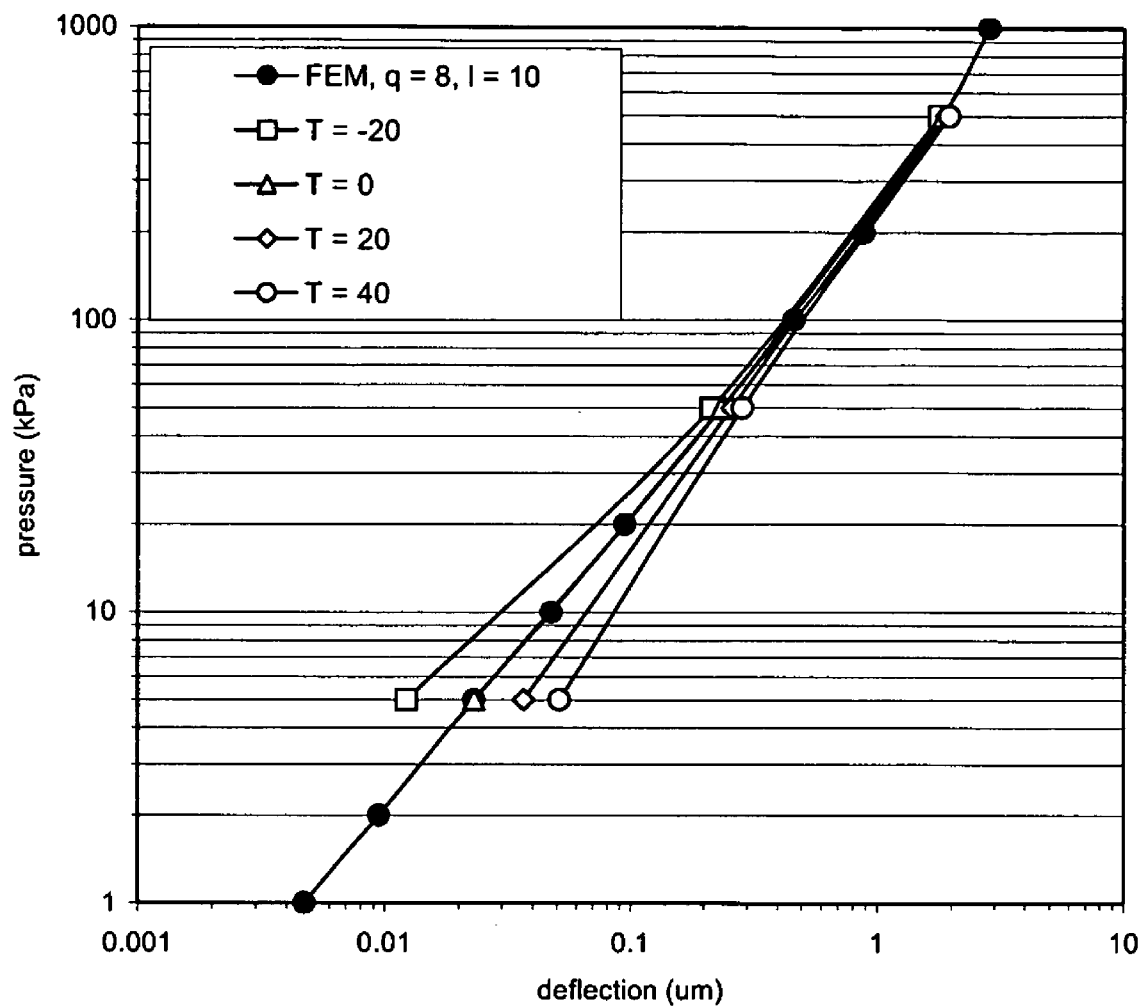
FIG. 32 illustrates the effect of temperature on the pressure-deflection response of a membrane with q=8 and l=10 μm.

The coefficient of thermal expansion for TiN is $9.4 \times 10^{-6}$ $K^{-1}$, which means that, for the range of likely operating temperatures, thermally induced stress might alter the sensor deflection. The effect of temperature on the sensor response is examined in FIG. 32 for a sensor with q=8 and l=10 mm. The range of temperatures T examined, from −20 to +40° C., can be considered as representative of the heat-up cycle which occurs when a vehicle initiates a journey in a cold environment. It is seen that below 100 kPa pressure difference, there is a strong effect of temperature. At higher applied pressures, typical of operation, the thermal stresses are swamped by pressure-induced stresses and the temperature has little effect on the sensitivity.

Thus, a corrugated membrane sensor has a linear response in the region of interest. The small size of the sensor means that it is suitable for installation in wheel hub/rim valve stem and valve cap systems.

Wafer Bonding

As discussed above in relation to FIGS. 3 to 23, the deep etch hole 56 needs to be sealed to maintain the fluid beneath the membrane 50 at a reference pressure. Typically, the reverse side of the wafer 32 is bonded to a sealing wafer.

Unfortunately, simply using a polymeric adhesive to bond a main wafer to the sealing wafer is not sufficient. The reference cavity (i.e. fluid beneath the membrane 50) seeks to maintain a constant pressure to ensure a minimum of calibration drift. The polymeric adhesive is permeable to air, which may result in leakage of air into the reference cavity because of the tire pressure. The flow rate across a permeable material is given by:

$$Q = \frac{P_{12} A \Delta P}{L} \quad (6)$$

where $P_{12}$ is the permeability of the material, A is the surface area of the material exposed to the pressure difference, $\Delta P$ is the pressure difference and L is the flow path length. The permeability of most polymers is of order $10^{-21}$ m$^3$ (STP) ms$^{-1}$ m$^{-2}$ Pa$^{-1}$, so for a pressure difference=300 kPa, cavity radius=50 μm, seal height=10 μm and seal (flow) length=10 μm, the flow rate is approximately $9.4 \times 10^{-20}$ m$^3$ s$^{-1}$. If the cavity height is 100 μm, then the total cavity volume is $7.9 \times 10^{-13}$ m$^3$, and approximately 100 days would be required for the reference cavity pressure to equilibrate with the tire pressure. Whilst this may be suitable for testing purposes, it would make such a device unsuited to practical use.

Another way to seal the reverse side of the wafer is to over-mold the sensor with plastic to increase the path length for leakage. The permeability of polymers is about ten times less than that of adhesives, and so a ten-year seal would require a seal length of approximately 0.5 mm. This is too long for a MEMS device that is less than 50 μm long. To maintain the high yield and versatility of the pressure sensor as a MEMS device, a different sealing solution is required.

Wafer bonding offers the possibility of a hermetic seal at the cost of a slightly different fabrication procedure. The most prevalent forms of wafer bonding are: direct wafer bonding, anodic (electrostatic) bonding and intermediate layer bonding (see Table 3).

TABLE 3

Wafer bonding techniques.

| Type of Bond | Description | $T_{bond}$ (°C.) | Surface Finish |
|---|---|---|---|
| Direct Wafer (Si Fusion) | Reactive surfaces brought into contact under high temperature | 800-1100 | <0.01 μm |
| Anodic (Electrostatic, Mallory Process) | High voltage (0.5 to 1.5 kV) applied across both wafers | 200-1000 | <1 μm |
| Intermediate Layer | Low melting temperature material applied to one or both wafer surfaces, bonds form when temperature and pressure are applied | | 1 μm |
| Au—Si | | 363 | |
| Glass Frit (e.g. Corning #75xx) | | 400-600 | |
| Au—Au | | <400 | |
| BCB* | | 250 | |
| PDMS (plasma treated) | | 25 | |
| Tin, $Si_3N_4$ | | 100-300? | |
| LPCVD PSG | | 1100 | |
| APCVD BO | | 450 | |
| Boron-Doped Si | | 450 | |
| Organics* | | <200 | |

BCB = benozcyclobutene,
PDMS = polydimethylsiloxane,
PSG = phosphosilicate glass.
*= unsuitable due to porosity.

In the first method, two ultra clean surfaces are brought into contact after they have been activated (e.g. the surfaces are made hydrophilic or hydrophobic); the bond forms at elevated temperatures (near 1000° C.). In the second, the two wafers are brought into contact, in either vacuum, air or an inert atmosphere, and a large voltage is applied across the wafers. The bond forms because of migration of ions from one wafer surface to the other. This method has relaxed requirements in terms of surface finish, which makes it more suitable for bonding two wafers that have undergone a series of fabrication steps; however, the high voltage may damage CMOS layers. The third option employs a layer of low melting point material that is deposited on one or both wafers on the contact face. The wafers are brought into contact at moderate temperatures and the bond forms at the interface once pressure is applied. There are many different materials that may be used to form the intermediate layer (e.g. $Si_3N_4$ TiN). The intermediate layer method overcomes the disadvantage of direct wafer (high cleanliness) and anodic (high voltage) bonding.

The invention may also be said to broadly consist in the parts, elements and features referred to or indicated herein, individually or collectively, in any or all combinations of two or more of the parts, elements or features, and wherein specific integers are mentioned herein which have known equivalents in the art to which the invention relates, such known equivalents are deemed to be incorporated herein as if individually set forth.

Although the preferred embodiment has been described in detail, it should be understood that various changes, substitutions, and alterations can be made by one of ordinary skill in the art without departing from the scope of the present invention.

The invention claimed is:

1. A pressure sensor assembly for fitting within the valve stem of a vehicle tire, the assembly comprising:
    a substrate assembly defining a plurality of holes;
    a pressure sensor mounted to the substrate assembly, the pressure sensor including a first deflectable membrane defining a first chamber and a first cap mounted to the membrane to form a second chamber; and
    a temperature compensation sensor mounted to the substrate assembly, the temperature compensation sensor including a second deflectable membrane mounted to the substrate assembly to define a third chamber and a second cap mounted to the other membrane to form a fourth chamber.

2. A pressure sensor assembly as claimed in claim 1, wherein the sensors are mounted adjacently on the same side of the substrate assembly.

3. A pressure sensor assembly as claimed in claim 1, wherein the first chamber is a sealed chamber and the first cap defines a plurality of holes so that the second chamber is an unsealed chamber.

4. A pressure sensor assembly as claimed in claim 3, wherein the second membrane defines a plurality of holes through which the third and fourth chambers are interconnected.

5. A pressure sensor assembly as claimed in claim 1, wherein the pressure sensor assembly is a micro-electromechanical system (MEMS) formed using integration circuit fabrication techniques.

6. A pressure sensor assembly as claimed in claim 5, wherein the substrate assembly includes:
    a silicon substrate layer;
    a CMOS layer deposited on the silicon substrate layer;
    a conductive layer deposited on the CMOS layer; and
    a passivation layer deposited on the conductive layer;
    wherein said plurality of holes pass through each layer.

7. A pressure sensor assembly as claimed in claim 6, wherein each membrane is conductive and the conductive layer and conductive membrane together form a pair of electrodes which can develop a capacitance between them.

8. A pressure sensor assembly as claimed in claim 1, wherein each membrane is formed from non-conductive material which is in contact with a piezo-electric material.

* * * * *